(12) United States Patent
Yanagawa et al.

(10) Patent No.: US 6,759,722 B2
(45) Date of Patent: Jul. 6, 2004

(54) SEMICONDUCTOR DEVICE AND METHOD OF MANUFACTURING THE SAME

(75) Inventors: Eiji Yanagawa, Tenri (JP); Akihiko Nakano, Nara (JP); Toshinori Ohmi, Nara (JP); Hironori Matsumoto, Nara (JP); Tadao Takeda, Ebina (JP); Hideyuki Unno, Ebina (JP); Hiroshi Ban, Machida (JP)

(73) Assignees: Sharp Kabushiki Kaisha, Tokyo (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/820,671

(22) Filed: Mar. 30, 2001

(65) Prior Publication Data

US 2001/0028115 A1 Oct. 11, 2001

(30) Foreign Application Priority Data

Mar. 31, 2000 (JP) ........................................ 2000-098431

(51) Int. Cl.[7] .............................................. H01L 29/82
(52) U.S. Cl. ...................................... 257/415; 257/782
(58) Field of Search ................................ 257/782, 783, 257/420, 415, 417, 723, 724, 787; 438/10, 17, 50

(56) References Cited

U.S. PATENT DOCUMENTS

| 4,467,342 A | * | 8/1984 | Tower |
| 5,264,699 A | * | 11/1993 | Barton et al. |
| 5,384,000 A | * | 1/1995 | Nishiguchi |
| 5,389,738 A | * | 2/1995 | Piosenka et al. |
| 5,861,652 A | | 1/1999 | Cole et al. |
| 5,877,547 A | | 3/1999 | Rhelimi |
| 5,960,319 A | | 9/1999 | Iwata et al. |
| 5,986,316 A | * | 11/1999 | Toyoda et al. |
| 6,351,682 B1 | * | 2/2002 | Doolittle |
| 6,352,073 B1 | * | 3/2002 | Kurosawa et al. |
| 6,441,396 B1 | * | 8/2002 | Adams et al. |

FOREIGN PATENT DOCUMENTS

| EP | 0 884 778 A2 | 12/1998 |
| FR | 2 727 226 | 5/1996 |
| JP | 01015957 | 1/1989 |
| JP | 05093659 | 4/1993 |
| JP | 11238750 | 8/1999 |

* cited by examiner

Primary Examiner—S. V. Clark
(74) Attorney, Agent, or Firm—Birch, Stewart, Kolasch & Birch, LLP

(57) ABSTRACT

In the present semiconductor device, a chip with an LSI circuit is secured to a board 3 (with the chip flipped) so as to be level. The LSI circuit on the chip is specified to operate normally only when the chip is level. Further, the back of the chip is processed so as to give stress to the chip. The chip has a reduced thickness of 50 μm or less (alternatively 30 μm to 50 μm). Therefore, when the chip is detached from the board, it deforms and is no longer level due to the stress, which prohibits the LSI circuit from operating normally. This way, the present semiconductor device ensures that no analysis can be conducted on the LSI circuit once the chip is detached.

21 Claims, 19 Drawing Sheets

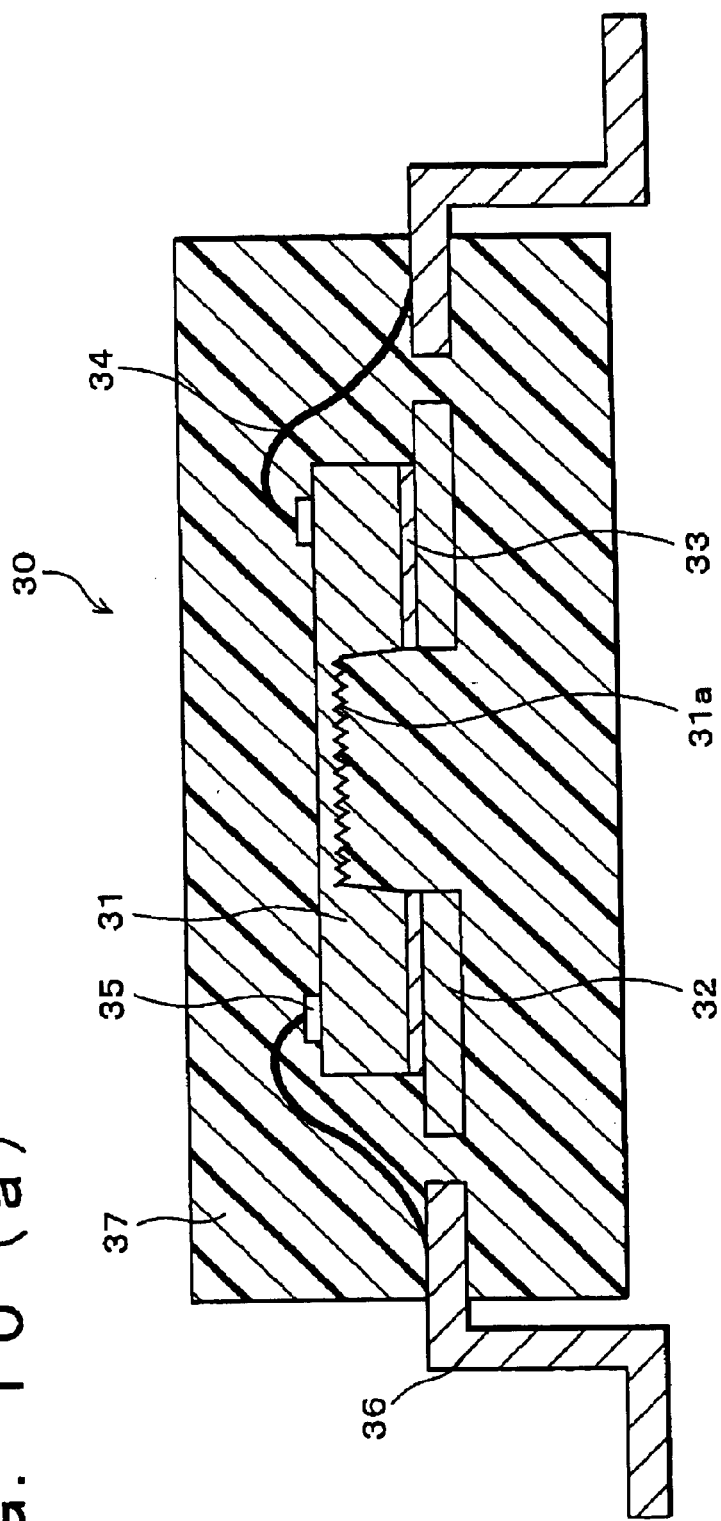
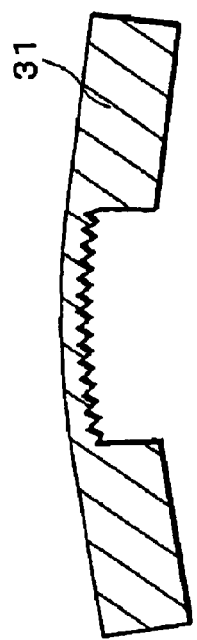
F I G. 1 0 (a)
F I G. 1 0 (b)

SEMICONDUCTOR DEVICE AND METHOD OF MANUFACTURING THE SAME

FIELD OF THE INVENTION

The present invention relates to a semiconductor device in which a semiconductor element is secured to a board and a method of manufacturing the same.

BACKGROUND OF THE INVENTION

Conventionally, semiconductor element chips (semiconductor elements; hereinafter, "chips") have been developed incorporating integrating transistors and an IC (integrated circuit) or LSI (large-scale integration) circuit.

The chip, when applied in a semiconductor device, is typically secured to a board and then sealed in a plastic package or the like, so as to provide protection to the chip from its external environment and allow easy handling of the chip during use.

An example is taken here to describe an arrangement of a packaged semiconductor device having a chip with a transistor-integrated circuit (integrated circuit).

FIG. 19 is an explanatory drawing showing a conventional arrangement of a packaged semiconductor device 101. The semiconductor device 101 is of a flipped-chip mounting type wherein the chip 102 is positioned so that its front faces the board 103. A package 108 made of epoxy resin is provided to cover the back of the chip 102, thereby sealing the chip 102.

The chip 102 is secured to the board 103 interposed by glue (anisotropic conducting glue) 105. The board 103 is made of glass epoxy prepared by immersing epoxy resin in glass fiber.

On the front of the chip 102 is there provided a pad section 107 as well as an integrated circuit (not shown). The pad section 107 has a bump 104 to establish contact to a wire section 106 made of copper film on the board 103.

Now, a typical method of manufacturing such a packaged semiconductor device will be described.

First, the wire section 106 with output wiring for external connection is provided on the board 103 at a position that matches the position of the pad section 107 on the chip 102.

Then, a bump 104 is fabricated of gold on the pad section 107 of the chip 102, followed by application of glue 105 onto the board 103.

The board 103 and chip 102 are stacked so that the wire section 106 matches the bump 104 (pad section 107) in position, thereby mounting the chip 102 on the board 103.

Thereafter, the chip 102 and board 103 are compressed and secured to each other, while heating at about 200° C. The glue 105 solidifies due to the heating, securing the chip 102 onto the board 103. The chip 102 is sealed by epoxy resin to form the package 108.

Generally, the chip 102 has a thickness of 200 $\mu$m or more. Besides, normally, the chip 102 is secured level (flat) onto the board 103 to retain its electrical properties.

Specific examples are disclosed about this kind of method of manufacturing a semiconductor device in Japanese Laid-Open Patent Application No. 11-238750/1999 (Tokukaihei 11-238750; published on Aug. 31, 1999), Japanese Laid-Open Patent Application No. 64-15957/1989 (Tokukaisho 64-15957; published on Jan. 19, 1989), and other documents.

Tokukaihei No. 11-238750 discloses a method of manufacturing a highly reliable semiconductor device of a flipped-chip mounting type by removing residual scum from a vicinity of the pad section on the chip and improving the adherence between the pad section (metal) and the bump (metal).

Tokukaisho No. 64-15957 discloses a method of seal an NMOS type (N-type metal oxide semiconductor) element chip in a semiconductor package with a gas and liquid, whereby a mechanical pressure (stress) is applied to the chip using a gas and liquid so as to increase current flow for improved performance of the NMOS element.

Japanese Laid-Open Patent Application No. 5-93659/1993 (Tokukaihei 5-93659; published on Apr. 16, 1993) discloses a distortion sensor which works by means of a stress being applied to various kinds of resistor elements, which is a technology not directly related to semiconductor elements, but rather to Tokukaisho No. 64-15957. The distortion sensor takes advantage of a glass layer which changes its electric resistance when distorted.

Incidentally, the semiconductor device 101 of a flipped-chip mounting type of FIG. 19 has a structure that does not readily allow observation of the integrated circuit provided on the front of the chip 102.

In other words, as mentioned above, the board 103 is secured on the front of the chip 102 interposed by the glue 105. Therefore, unsealing the epoxy resin package 108 covering the back of the chip 102 permits only a look at the back of the chip 102, allowing no observation or analysis of the structure of the integrated circuit.

However, the epoxy resin forming the board 103, the anisotropic conducting glue 105, etc. are removable using an etchant containing fuming nitric acid or sulfuric acid, for example. Therefore, the board 103 and glue 105 can be peeled off (removed) by the use of the etchant, separating the chip 102 from all the other parts. The chip 102, once separated, is prone to any kind of analysis; the integrated circuit on the front can be observable, and its electrical properties are measurable by directly contacting probes.

Further, the chip 102 secured level onto the board 103 in the package 108, i.e., packaged, has a thickness of 200 $\mu$m or more. Therefore, the chip 102 continues to be level even after it is separated from the all the other parts for analysis; the integrated circuit on the chip 102 operates normally exhibiting the same electrical properties as when it is packaged.

In short, the conventional semiconductor device 101, when the epoxy resin is peeled to separate the chip 102 from all the other parts, is highly prone to analysis on its integrated circuit and other parts due to its arrangement and package method. This gives a rise to a problem that secrets cannot be well concealed.

Here, Tokukaihei 11-238750 and Tokukaisho 64-15957 mentioned above disclose technologies to improve the performance of the chip, but completely fails to pay attention to methods prohibiting the analysis of the chip (integrated circuit). These technologies still allow separation of the chip from all the other parts for analysis of the integrated circuit or other members.

Tokukaihei 5-93659 above, relating to a distortion sensor, belongs basically to a different field of technology from the present invention and neither discloses nor suggests the protection of the chip from analysis.

SUMMARY OF THE INVENTION

The present invention has an object to offer a semiconductor device which can completely prevent analysis of the integrated circuit of the semiconductor element secured to the board, as well as a method of manufacturing such a semiconductor device, i.e., to offer a semiconductor device which ensures protection of secrets about the semiconductor element, as well as a method of manufacturing such a semiconductor device.

In order to achieve the object, a semiconductor device in accordance with the present invention includes a semiconductor element, with an integrated circuit, secured to a board, is such that the semiconductor element is secured level and specified to operate normally only when the semiconductor element is level.

According to the arrangement, the semiconductor element is specified to operate normally only when it is level. Therefore, if the semiconductor element is no longer capable of sustaining its level shape as a result of, for example, detachment of the semiconductor element from the board, the semiconductor element does not operate normally due to a resultant change and the like in its electrical properties. Thus, secrets can be concealed safely about the semiconductor element.

In order to achieve the object, a method of manufacturing a semiconductor device in accordance with the present invention includes, after securing a semiconductor element with an integrated circuit to a board so as to be level, the step of processing at least a part of a back of the semiconductor element to develop such stress that when the semiconductor element is detached from the board, at least a part thereof deforms.

According to the arrangement, the semiconductor element is given such stress that when the semiconductor element is detached from the board, at least a part thereof deforms. Therefore, if the semiconductor element is detached from the board and can no longer sustain its level shape, the semiconductor element does not operate normally due to a resultant change and the like in its electrical properties. This ensures that any analysis is prohibited from being conducted on the integrated circuit on the semiconductor element. Thus, a semiconductor device can be manufactured in which secrets can be concealed safely about the semiconductor element.

For a fuller understanding of the nature and advantages of the invention, reference should be made to the ensuing detailed description taken in conjunction with the accompanying drawings.

BRIEF DESCRIPTION OF THE DRAWINGS

FIG. 10(a) is an explanatory drawing schematically showing an arrangement of a semiconductor device of a third embodiment in accordance with the present invention.

FIG. 10(b) is a cross-sectional view showing the semiconductor device of FIG. 10(a) which has deformed due to removal of a semiconductor element chip from it.

DESCRIPTION OF THE EMBODIMENTS

A semiconductor device in accordance with the present invention (hereinafter, "the present semiconductor device") has a semiconductor element with an integrated circuit.

The semiconductor element is secured level onto a board in, for example, a package.

The semiconductor element is specified to operate normally only when it is level. Conversely, the semiconductor element is specified to, when it becomes no longer capable of continuing to be level, cause a change in electrical or other properties of its transistor and integrated circuit and fail to operate normally.

Further, according to the specifications, the semiconductor element is receiving a stress (static stress) as a result of processing carried out on at least a part of its back and, when detached from the board in the present semiconductor device, becomes no longer capable of continuing to be level and deforms (e.g., warps) at least partially due to the stress.

For these specifications, when the semiconductor element is separated from all the other parts and removed from the present semiconductor device, it deforms due to the stress and becomes no longer capable of continuing to be level, failing to operate normally.

Since the present semiconductor device is specified in this manner, when the semiconductor element is detached from the board, the semiconductor element deforms and changes its electrical and other properties, thereby being prevented from operating normally. The semiconductor element, when detached, can be thus protected from property and circuit analysis.

The present semiconductor device must be mounted to an external circuit when used. The present invention has an object to exploit, for various purposes, such a phenomenon that transistors, ICs (integrated circuits), and LSI (large-scale integration) circuits change their electrical properties when deformed; one of the purposes is to provide protection to the semiconductor element from analysis. The sensors and mounting methods which will be described in the following embodiments constitute mere examples.

Note that in the present invention, "the semiconductor element being detached from the board" refers to the condition in which at least a part of the semiconductor element has peeled off the board.

[Embodiment 1]

A first embodiment in accordance with the present invention will be now described. Note that the scope of the present invention is by no means limited to this embodiment.

Figure 1A:
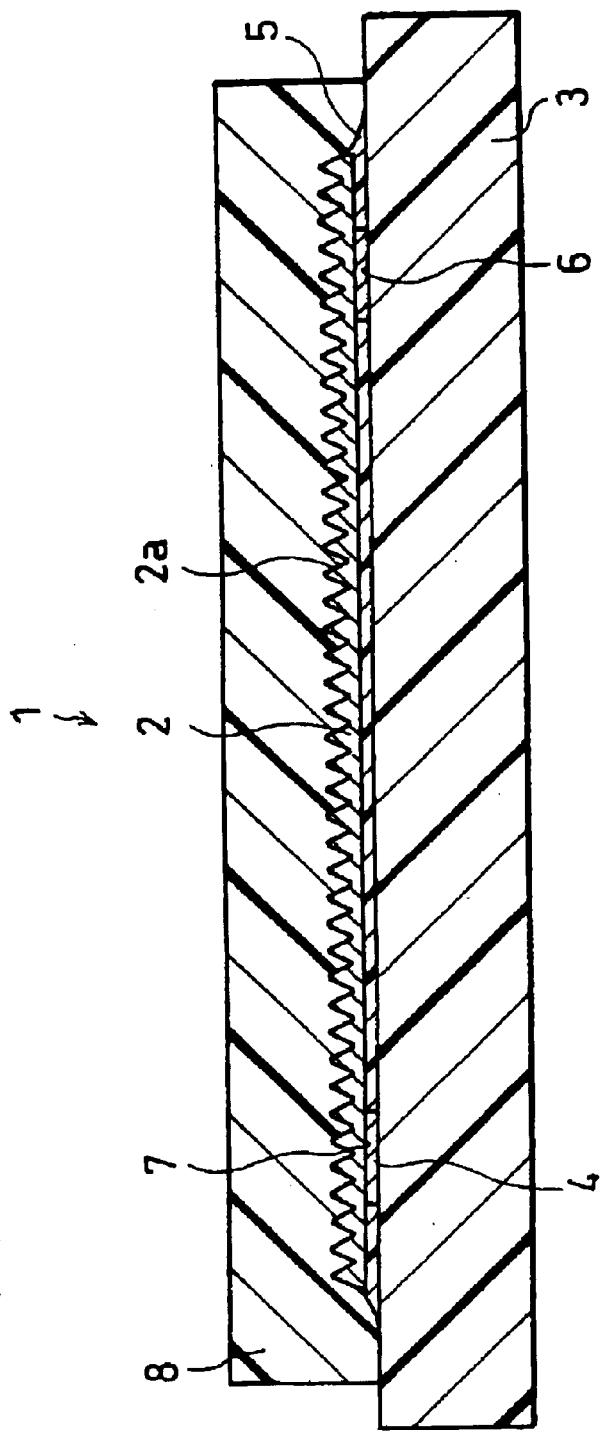
FIG. 1(a) is a cross-sectional view schematically showing an arrangement of a semiconductor device of a first embodiment in accordance with the present invention.

Referring to FIG. 1(a), a semiconductor device 1 of the present embodiment is packaged, i.e., includes a semiconductor element chip (semiconductor element; hereinafter, "chip") 2 which is sealed in a package 8.

The semiconductor device 1 is of a flipped-chip mounting type whereby the chip 2 is positioned so that its front faces a board 3. The package 8 made of epoxy resin or other material is provided in a manner to cover the chip 2 on its back, thereby sealing the chip 2.

The board 3, formed from a glass epoxy board, has a wire section 6 made from copper foil on its side which contacts to the chip 2. The board 3 is fabricated by, for example, immersing epoxy resin in glass fiber.

The chip 2 is a silicon-made semiconductor element chip and is secured onto the board 3 by a glue (anisotropic conducting glue) 5.

On the front of the chip 2 there are provided an electronic circuit section which will be described later and a pad section 7. The pad section 7 has a bump 4 to establish contact to a wire section 6 on the board 3.

Figure 1B:
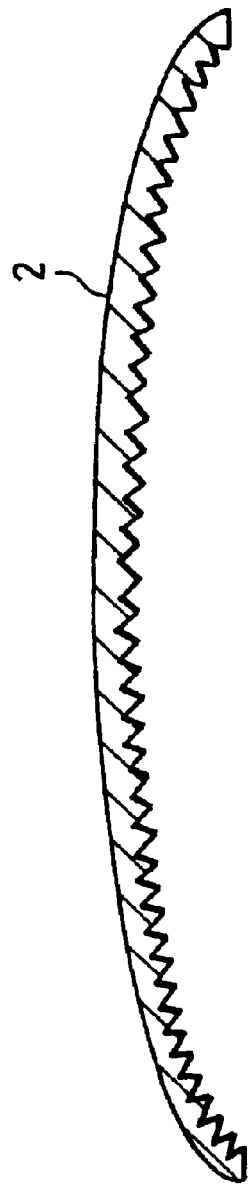
FIG. 1(b) is a cross-sectional view showing the semiconductor device of FIG. 1(a) which has deformed due to removal of a semiconductor element chip from it.

The back 2a of the chip 2 is subjected to rough surface processing to apply a stress to the chip 2 to deform the chip 2. Due to the processing of the back 2a, the chip 2 warps due to stress when removed from the package 8 (when detached from the board 3) as shown in FIG. 1(b).

A typical conventional semiconductor element has a thickness of 200 μm or more. By contrast, the chip 2 in the semiconductor device 1 has a thickness of 50 μm or less, preferably 30 μm to 50 μm, because of the rough surface processing. The chip 2 is therefore thinner entirely than conventional semiconductor elements and more prone to deformation caused by the stress applied to the processed back 2a when detached from the board 3.

An electronic circuit section provided on the front of the chip 2 will be now described.

Figure 2:
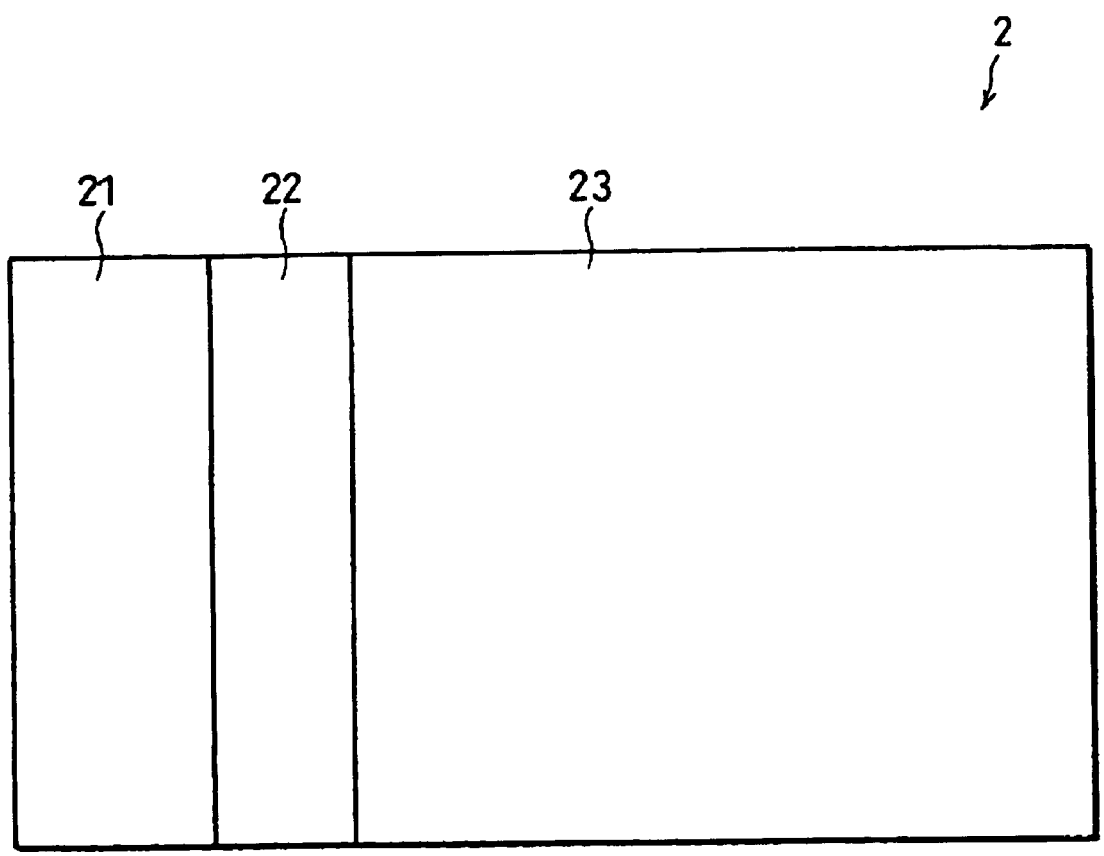
FIG. 2 is a plan view schematically showing an arrangement of the semiconductor element chip of FIG. 1(b).

FIG. 2 is an explanatory drawing showing an arrangement of the electronic circuit section. As shown in FIG. 2, the electronic circuit section includes a transistor section 21, a sensor section 22 and an LSI circuit section 23.

The transistor section 21 is a part where transistors (of an NMOS type (N-type metal oxide semiconductor)) are provided at high density. The sensor section 22 is a part where a detector section (detector means; will be detailed later) is provided to detect electrical properties of the transistors. The LSI circuit section 23 is a part where circuitry including an IC (integrated circuit) or LSI (large-scale integration) circuit is provided.

The transistor in the transistor section 21 is specified to exhibit electrical properties according to the shape of the transistor section 21. In other words, the transistor possesses different electrical properties when the transistor section 21 is level (normal period) and when the transistor section 21 is deformed (deformed period).

When the chip 2 is detached from the board 3 and has warped convexly due to stress, the transistor section 21 provided on the front of the chip 2 warps accordingly. The semiconductor device 1 is therefore specified so that when the chip 2 is detached from the board 3, the transistor in the transistor section 21 changes its electrical property.

Now, changes in electrical properties of an NMOS transistor will be described which occur when the transistor section 21 deforms.

A stress (external force) was applied to the transistor section 21, for example, so that it warped convexly in a direction perpendicular to current flow through the transistor and normal to the front of the chip 2, and as a result, the front of the transistor section 21 actually warped due to the stress, forming a warped surface having a radius (r) of 10 mm. In these circumstances, the transistor, when activated, showed a 10% increase in its channel current.

In this manner, the transistor is specified to change its electrical properties according to the shape of the transistor section 21.

The detector section in the sensor section 22 is for detecting an electrical properties of the transistor in the transistor section 21 and controlling the LSI circuit provided in the LSI circuit section 23 according to results of the detection.

In other words, the detector section is specified to activate the LSI circuit if it detects an electrical property exhibited by the transistor at normal period (exhibited by the transistor provided in a level part of the transistor section 21) and to deactivates the LSI circuit if it detects an electrical property exhibited by the transistor at deformed period.

In this manner, the semiconductor device 1 is specified so that the detector section detects a change in electrical properties (current, voltage, etc.) of the transistor caused by the warp of the chip 2 (transistor section 21) to utilize the results in the control of the operation of the LSI circuit.

As the detector section may OP-amplifier or another analog circuit be used for example. The OP-amplifier is for detecting a change in electrical properties of the transistor which occurs when the level transistor section 21 deforms.

Figure 3:
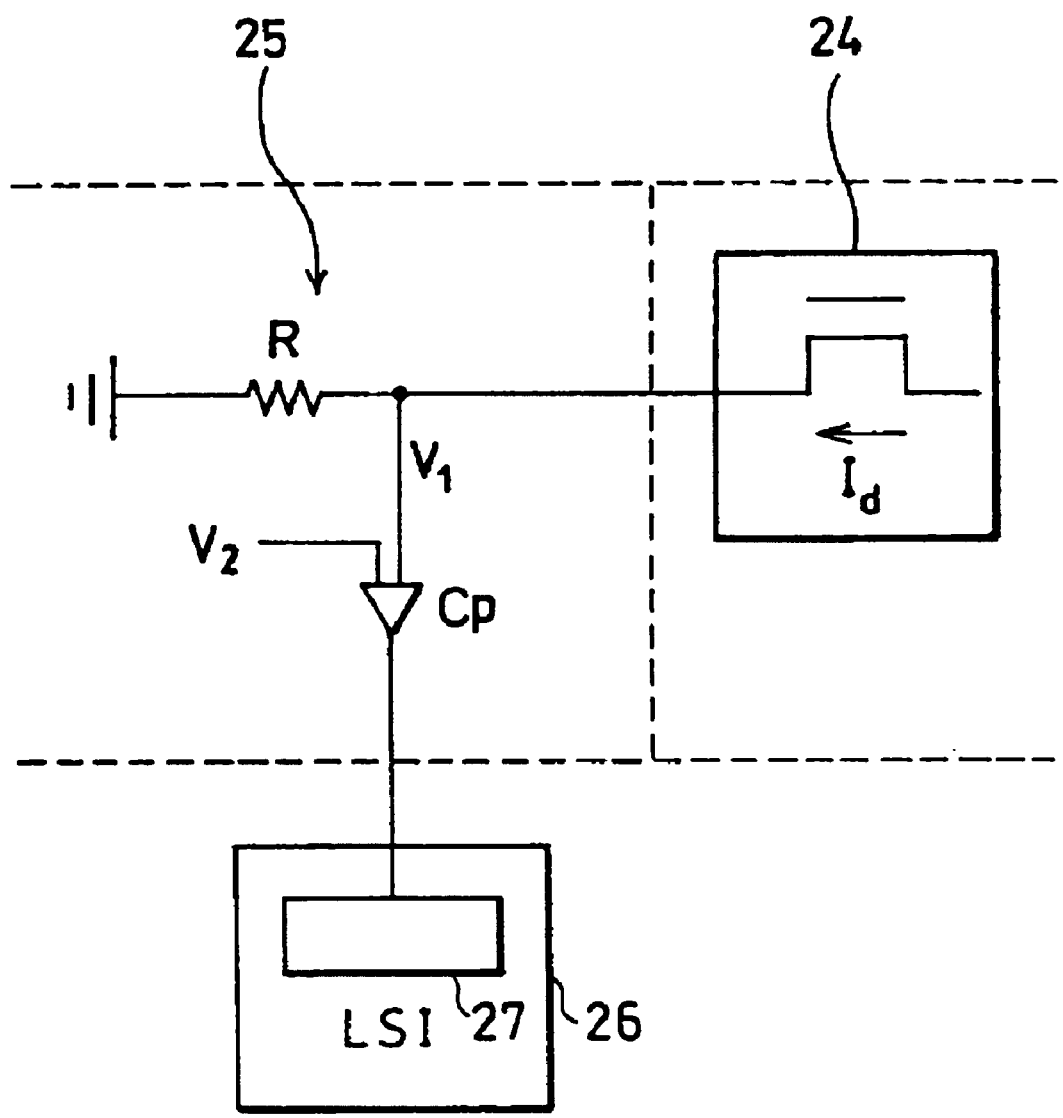
FIG. 3 is a circuit diagram showing, as an example, an arrangement of a distortion sensor provided in a sensor section, a transistor provided in a transistor section, and an LSI circuit provided in a LSI circuit section of a semiconductor element chip of FIG. 1(b).

Now, referring to FIG. 3, a concrete arrangement example will be now described of the electronic circuit section, especially the distortion sensor, in the chip 2. As shown in FIG. 3, the electronic circuit section includes a transistor 24, a distortion sensor 25, and an LSI circuit 26.

The distortion sensor 25 is an OP-amplifier with a resistor R and a comparator Cp, acting as the aforementioned detector section. As shown in FIG. 3, in the distortion sensor 25, the resistor R is connected at one of its ends to the transistor 24 in the transistor section 21 (see FIG. 2) and grounded at the other end.

The comparator Cp has two input terminals and an output terminal. One of the input terminals is connected to a wire connecting the resistor R to the transistor 24. A predetermined voltage $V_2$ is applied in advance to the other input terminal. The output terminal is connected to the LSI circuit 26 in the LSI circuit section 23 (see FIG. 2).

In these circumstances, the predetermined voltage $V_2$ is equal to or exceeds the characteristic voltage $V_1$ of the transistor 24 at normal period and is specified lower than the characteristic voltage $V_1$ of the transistor 24 at deformed period.

The characteristic voltage $V_1$ refers to a voltage the transistor 24 generates when it receives a drive voltage. As the transistor 24 receives a drive voltage, it outputs a characteristic current $I_d$ which changes in value according to the shape of the transistor section 21. The value of the characteristic voltage $V_1$ is determined by the characteristic current $I_d$ and the resistor R connected to the transistor 24.

As describe earlier, the characteristic current $I_d$ of the transistor 24 increases in value as the transistor section 21 warps, which means that the characteristic voltage $V_1$ increases as the transistor section 21 warps.

The comparator Cp compares the characteristic voltage $V_1$ with the predetermined voltage $V_2$ to determine which voltage is higher. According to its specifications, the comparator Cp outputs low signal (operation signal) from its output terminal to the LSI circuit 26 if the characteristic voltage $V_1$ is either lower than or equal to the predetermined voltage $V_2$, and conversely, outputs high signal to the LSI circuit 26 if the characteristic voltage $V_1$ is higher than the predetermined voltage $V_2$.

The LSI circuit 26 has an operation prohibition circuit 27 for controlling the operation of the LSI circuit 26 itself according to an output signal of the distortion sensor 25 (comparator Cp).

The operation prohibition circuit 27 allows the LSI circuit 26 to operate when it receives low signal from the distortion sensor 25. Meanwhile, the operation prohibition circuit 27 is specified to prohibit the operation of the LSI circuit 26 when it receives high signal or no signal at all from the distortion sensor 25. To put it differently, according to specifications, the LSI circuit 26 is allowed to operate only when it receives low signal from the distortion sensor 25.

Next, the operation of the electronic circuit section in accordance with conditions of the chip 2 (transistor section 21) will be described.

At normal period, i.e., when the chip 2 is secured to the board 3 and packaged so that the transistor section 21 is level (normal conditions), the transistor 24 exhibits normal electrical properties. Therefore, the predetermined voltage $V_2$ is equal to or exceeds the characteristic voltage $V_1$ ($V_1 \leq V_2$), causing the comparator Cp in the distortion sensor 25 to output low signal to the LSI circuit 26. The LSI circuit 26 hence operates normally.

By contrast, when the package 8 of the semiconductor device 1 is opened and the chip 2 is detached from the board 3, as shown in FIG. 1(b), the chip 2 (and the transistor section 21) warps convexly due to stress.

The electrical properties of the transistor 24 thereby change, and the transistor 24 outputs a characteristic current $I_d$ at an increased value. Consequently, the characteristic voltage $V_1$ becomes greater than the predetermined voltage $V_2$ ($V_1 > V_2$), and the comparator Cp in the distortion sensor 25 outputs high signal to the LSI circuit 26. Receiving the high signal, the operation prohibition circuit 27 causes the LSI circuit 26 to stop operating.

As described above, in the semiconductor device 1, the chip 2 is secured level onto the board 3 (with the chip being flipped). Further, the chip 2 is specified to, when detached from the board 3, deform due to the stress which develops as a result of the rough surface processing carried out on the back 2a.

The chip 2 specified to operate normally when it is level and to fail to operate normally when it has deformed. In other words, in the chip 2, as the distortion sensor 25 detects changes in electrical properties of the transistor 24 caused by deformation, the operation prohibition circuit 27 stops the LSI circuit 26 from operating.

This ensures that in the semiconductor device 1, any analysis is prohibited from being conducted on the LSI circuit 26 of the chip 2 when the chip 2 is detached from the board 3. Thus, secrets can be concealed safely about the chip 2.

As mentioned earlier, the LSI circuit 26 is specified to be prohibited by the operation prohibition circuit 27 from operating when it receives no signal. Therefore, the LSI circuit 26 is not operable alone (when detached from the LSI circuit section 23); in these conditions, no analysis of the circuit is ever possible by means of probing.

Now, a method of manufacturing the semiconductor device 1 will be described.

First, a chip 2 having a thickness of 200 μm or more is prepared, including a pad section 7. A wire section 6 with output wiring for external connection is then provided on the board 3 at a position that matches the position of the pad section 7 of the chip 2. This is followed by fabrication of a bump 4 of gold on the pad section 7 of the chip 2.

Figure 4:
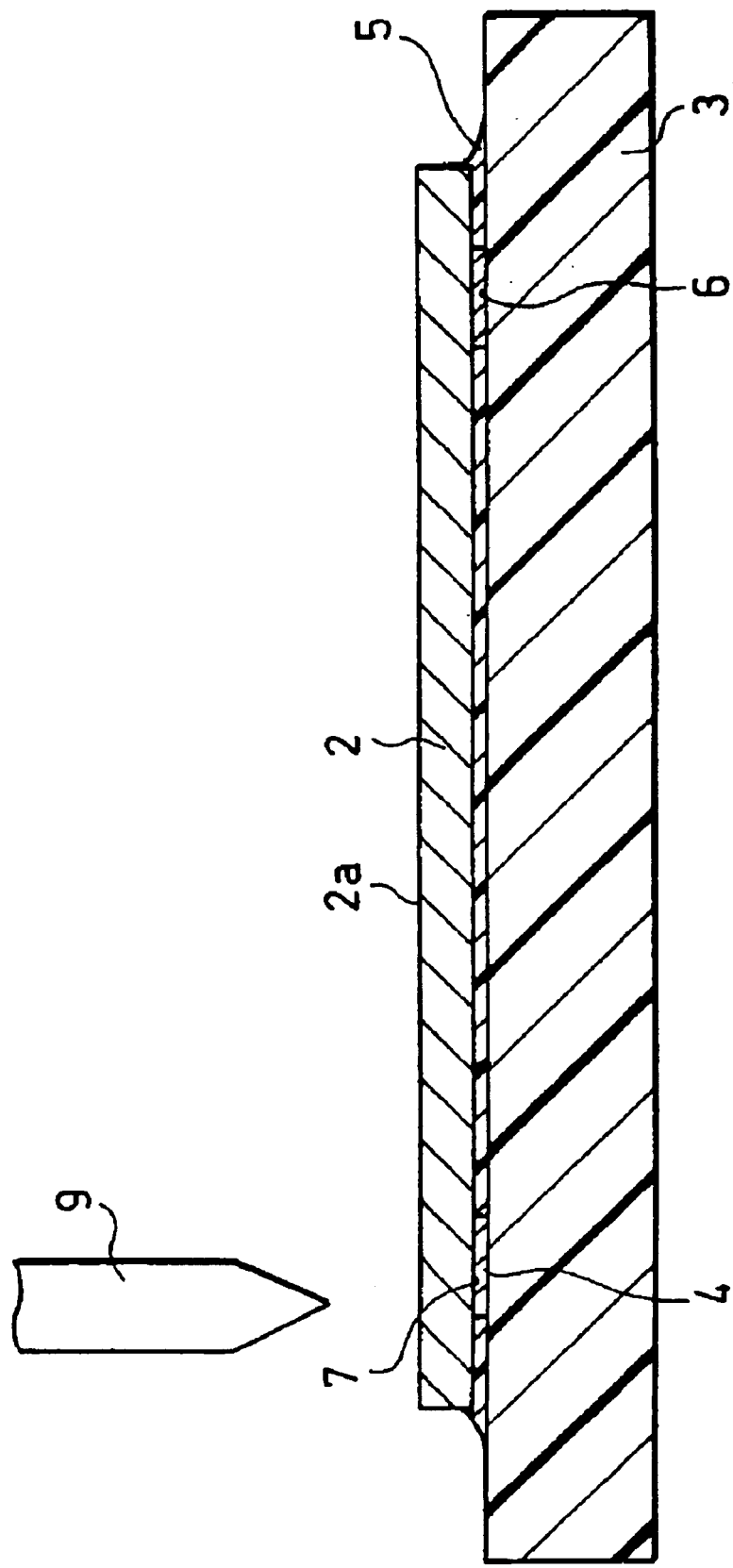
FIG. 4, in reference to an example of a manufacturing process of the semiconductor device of FIG. 1(a), is a cross-sectional view showing the semiconductor element chip being secured to a board.

As shown in FIG. 4, glue (anisotropic conducting glue) 5 is applied on the board 3. Thereafter, the board 3 and chip 2 are stacked so that the wire section 6 matches the bump 4 (pad section 7) in position, thereby mounting the chip 2 on the board 3.

Next, the chip 2 and board 3 are compressed and secured to each other, while heating at about 200° C. The glue 5 solidifies due to the heating, securing the chip 2 onto the board 3. By these steps, the chip 2 is mounted in a flipped posture to be level on the board 3.

The board 3 on which the chip 2 is secured is loaded at a predetermined position in a dicing machine. The back 2a of the chip 2 is scraped (subjected to rough surface processing) entirely using a dicing blade 9 provided in the dicing machine as shown in FIG. 5 and FIG. 6.

The scraping is carried out to reduce the thickness of the chip 2 to 50 μm or less, preferably to a range of 30 μm to 50 μm.

Figure 5:
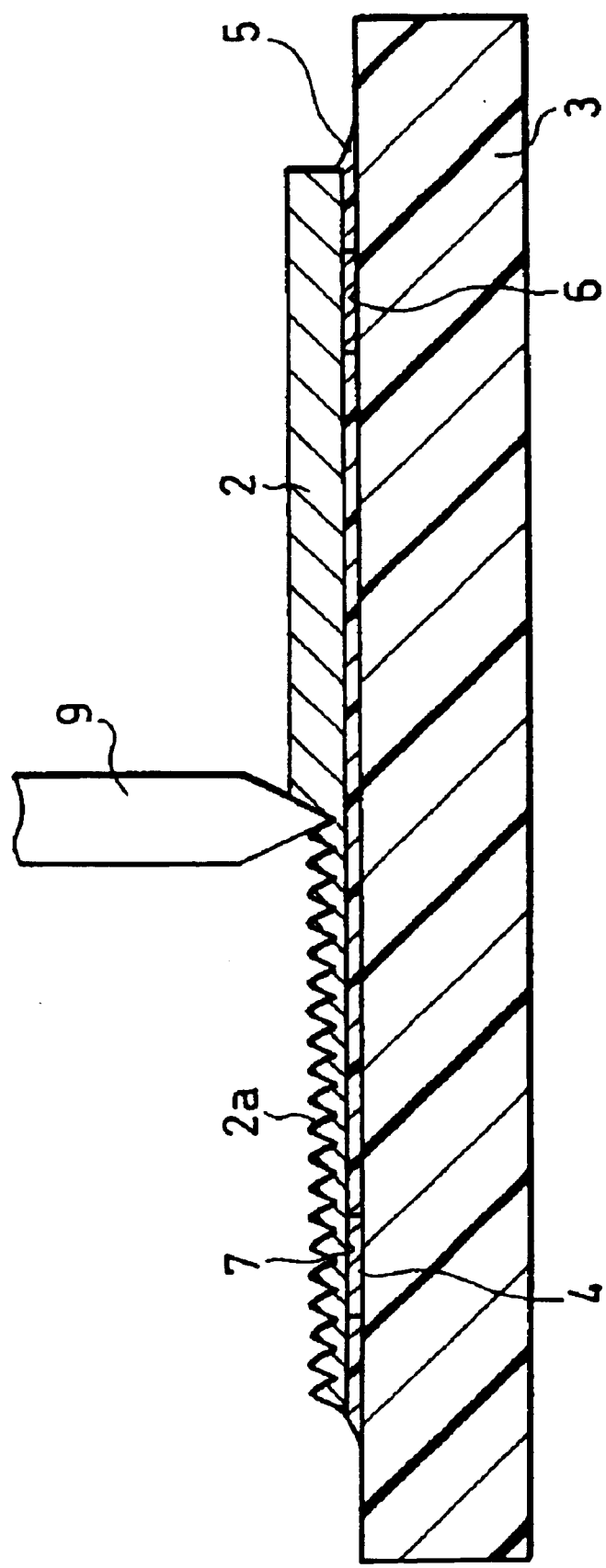
FIG. 5, in reference to an example of a manufacturing process of the semiconductor device of FIG. 1(a), is a cross-sectional view showing the semiconductor element chip being processed on its back.
Figure 6:
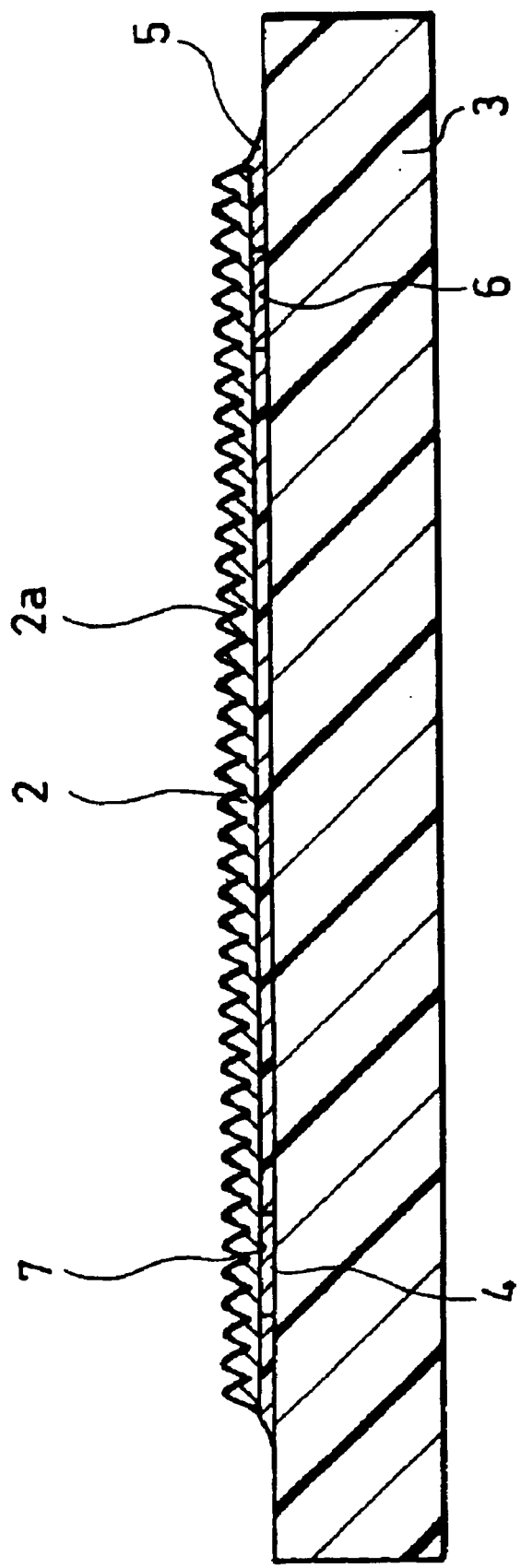
FIG. 6, in reference to an example of a manufacturing process of the semiconductor device of FIG. 1(a), is a cross-sectional view showing the semiconductor element chip having been processed on its back.

In addition, the scraping of the back 2a by means of the dicing blade 9 is preferably carried out in a specified direction (for example, in a direction normal to the paper showing FIG. 5). Thus, the back 2a of the chip 2 is shaped by the scraping so that the chip 2 readily deforms due to stress.

The scrape processing carried out on the entirety of the back 2a renders the chip 2 entirely thinner, enabling predetermined stress to be applied to the chip 2 entirely.

Figure 7:
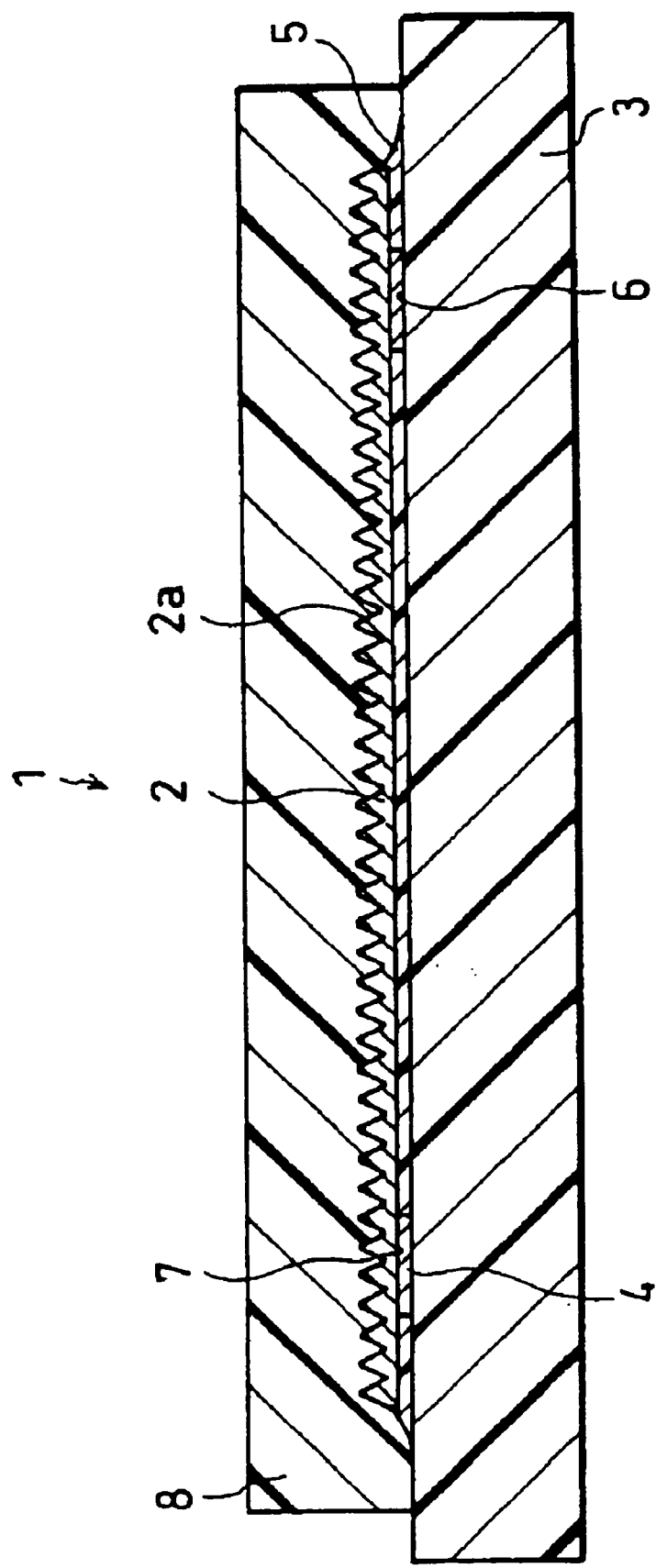
FIG. 7, in reference to an example of a manufacturing process of the semiconductor device of FIG. 1(a), is a cross-sectional view showing the semiconductor element chip having been packaged.

Next, as shown in FIG. 7, the chip 2 is sealed by epoxy resin using a predetermined mold to form a package 8. The manufacture of the semiconductor device 1 is hence completed.

In this manner, the chip 2 has its back 2a subjected to rough surface processing and therefore, has such a structure that once it is detached from the board 3 and deforms due to stress, it does not easily return to the level shape.

The structure thereby never allows the chip 2 to completely return to the level shape even by, for example, vacuum adsorption on a level base. To put it differently, the chip 2, once deformed, by no means completely returns to the level shape. Nor can any analysis be conducted on the LSI 26 and other circuits, once the chip 2 is deformed, as described earlier.

Note that the chip 2 is scraped after being mounted in a flipped posture. Therefore, the chip 2 can retain its level shape inside the semiconductor device 1 even when it is thinned down and receives stress.

The scrape processing by means of the dicing blade 9 produces no adverse effects on devices, such as the transistor 24 and LSI circuit 26 in the chip 2, which we confirmed through experiments and other methods.

The scraping by means of the dicing blade 9 is preferably carried out so as to render the steps formed by the dicing (groove pitches formed by the scraping) as short as possible. Short steps would enable a stress to be applied to the chip 2 easily.

Further, prior to the scraping by means of the dicing blade 9, the chip 2 may be thinned down entirely to some extent (for example, about 50 $\mu$m) by a typical scrape or other method, as required.

In the present embodiment, it is specified that the scraping of the back 2a of the chip 2 using the dicing blade 9 is carried out in a specified direction (for example, in a direction normal to the paper showing FIG. 5); however, the scraping may be carried out in whichever direction that results in easy deformation of the chip 2 due to stress or may be carried out in two or more different directions.

In the present embodiment, it is specified that the steps formed by the scraping are rendered as short as possible; however, the scraping requires no particular limitations.

In the present embodiment, it is specified that the dicing blade 9 is used in the rough surface processing of the entire back 2a of the chip 2; however, there are no particular limitations as to which part(s) of the chip 2 is (are) to be thinned down. Only the transistor section 21 may be thinned down, for example.

However, the chip 2 is specified to detect electrical properties of the transistor 24 using the distortion sensor 25, as described earlier. Therefore, the chip 2 is preferably thinned down in such a manner that at least the transistor section 21 deforms due to stress.

The present embodiment only refers to a case where the back 2a of the chip 2 is entirely scraped by dicing; however, the back 2a of the chip 2 may be scraped by a method other than dicing. Examples include physical scraping by means of sand blast or sandpaper and treatment by means of laser beam projection.

Scraping methods other than dicing will be now described.

If the back 2a of the chip 2 is to be treated by means of a laser as an example, prior to the treatment, the chip 2 is thinned down to some extent (for example, about 50 $\mu$m) by a typical scrape or other method.

The board 3 on which the chip 2 is secured is loaded in a predetermined place in a laser marker device (laser beam projection device). The laser beam is preferably a converging laser beam which is a focused energy beam. Specifically, such a converging laser beam can be generated by means of, for example, a laser light source using YAG (yttrium aluminum garnet) as a solid laser medium.

The back 2a of the chip 2 is treated by projection of a laser beam with, for example, the second harmonic wavelength of 532 nm. As a result of the treatment, numerous minute dents or irregularities are formed on the back 2a, enabling a predetermined stress to be applied to the chip 2.

There are no particular limitations on the wavelength of the laser beam or requirements in the projection. However, the laser beam with the above specified wavelength produces no adverse effects to devices, such as the transistor 24 and LSI circuit 26 of the chip 2, which we confirmed through experiments and other methods.

If the back 2a of the chip 2 is to be scraped by means of sand blast as another example, prior to the scraping, the chip 2 is thinned down to some extent similarly to the foregoing case.

The board 3 on which the chip 2 is secured is loaded in a predetermined place in a sand blast processing device, and the back 2a of the chip 2 is scraped so that the chip 2 has a thickness of, for example, 50 $\mu$m or less, preferably in a range of 30 $\mu$m to 50 $\mu$m. For the scraping, calcium carbonate particles of, for example, #1000 (about 15 $\mu$m) are preferably used as sand blast particles (grind particles).

As a result of the scrape processing, numerous minute dents or irregularities are formed on the back 2a, enabling a predetermined stress to be applied to the chip 2.

There are no particular limitations on the kind of the sand blast particles or requirements in the scraping. However, the calcium carbonate particles produce no adverse effects to devices, such as the transistor 24 and LSI circuit 26 of the chip 2, which we confirmed through experiments and other methods.

Alternatively, if the back 2a of the chip 2 is to be manually scraped by means of sandpaper as another example, prior to the scraping, the chip 2 is thinned down to some extent similarly to the foregoing cases.

The back 2a of the chip 2 is scraped using sandpaper so that the chip 2 has a thickness of, for example, 50 $\mu$m or less, preferably in a range of 30 $\mu$m to 50 $\mu$m. As a result of the scrape processing, numerous minute dents or irregularities are formed on the back 2a, enabling a predetermined stress to be applied to the chip 2.

There are no particular requirements in the scraping using sandpaper. However, the use of sandpaper of a relatively large particle size is preferable, since it would enable easy application of stress to the chip 2. The use of sandpaper produces no adverse effects to devices, such as the transistor 24 and LSI circuit 26 of the chip 2, which we confirmed through experiments and other methods.

The scraping by means of sandpaper is carried out manually and requires good attention. However, it is the easiest processing method.

[Embodiment 2]

A second embodiment in accordance with the present invention will be now described. Here, for convenience, members of the present embodiment that have the same function as members of the first embodiment, and that are mentioned in that embodiment are indicated by the same reference numerals and description thereof is omitted.

Figure 8A:
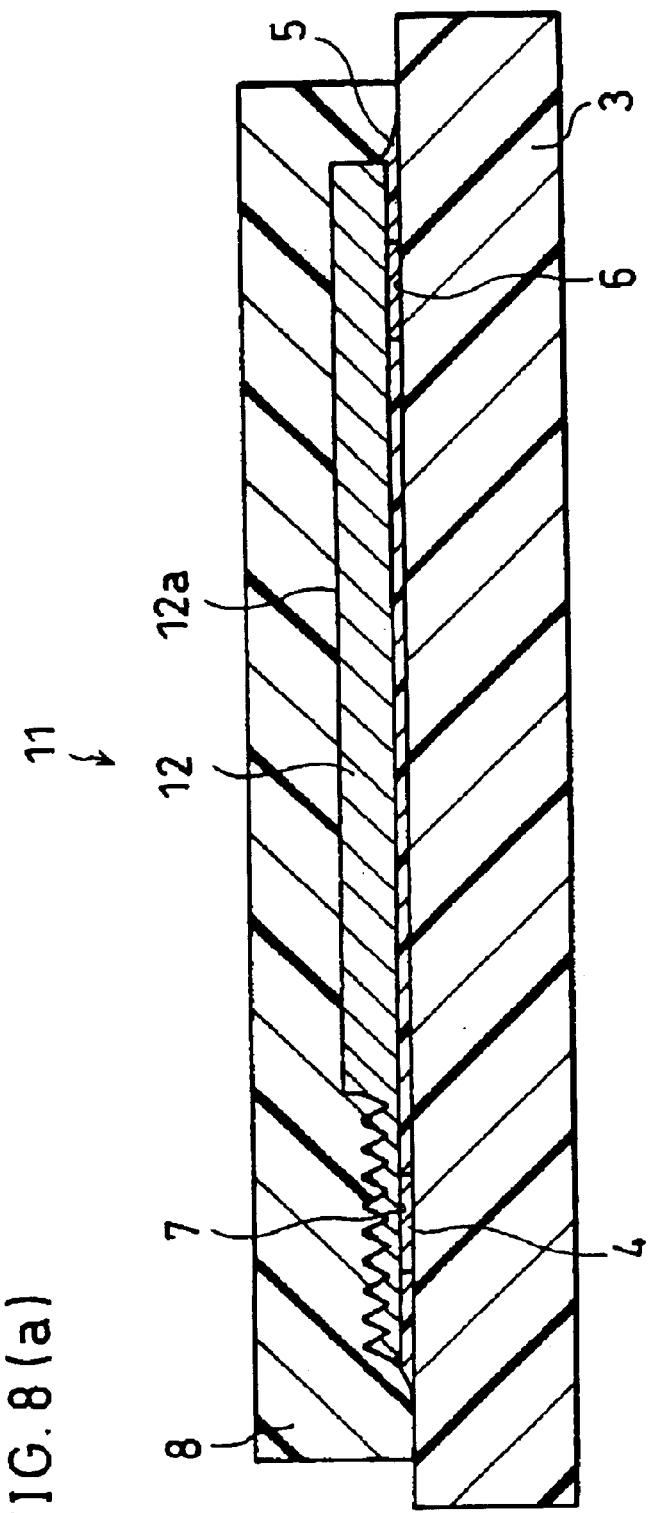
FIG. 8(a) is a cross-sectional view schematically showing an arrangement of a semiconductor device of a second embodiment in accordance with the present invention.

FIG. 8(a) is an explanatory drawing showing an arrangement of a semiconductor device 11 of the present embodiment. As shown in this Figure, the semiconductor device 11 is different from the semiconductor device 1 in that the chip 2 is replaced with a chip 12.

Figure 8B:
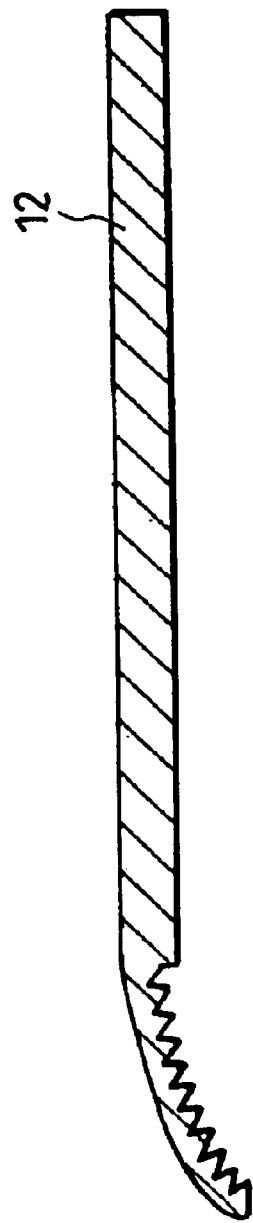
FIG. 8(b) is a cross-sectional view showing the semiconductor device of FIG. 8(a) which has deformed due to removal of a semiconductor element chip from it.

As shown in FIGS. 1(a) and 1(b), the chip 2 in the semiconductor device 1 has its back 2a subjected to rough surface processing. By contrast, as shown in FIGS. 8(a) and 8(b), the chip 12 in the semiconductor device 30 is has a part of its back 12a subjected to the rough surface processing.

Figure 9A:
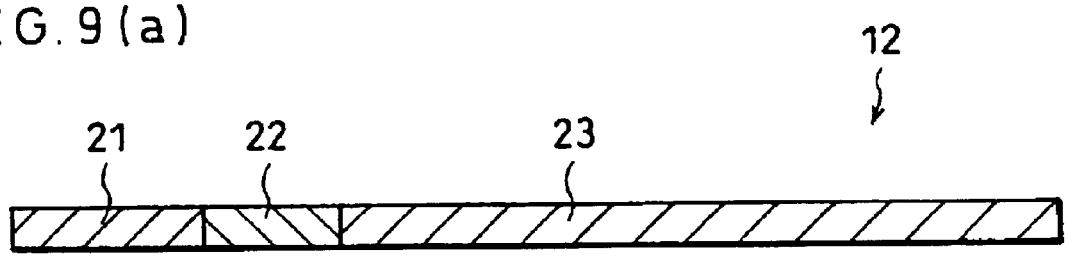
FIG. 9(a) is an explanatory drawing showing a preprocessing arrangement of the semiconductor element chip of FIG. 8(b).
Figure 9B:
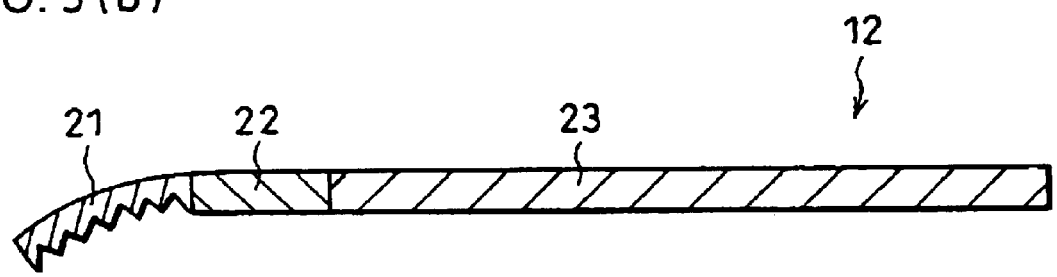
FIG. 9(b) is a cross-sectional view showing the semiconductor element chip of FIG. 8(b) which has distorted.

Specifically, as shown in FIGS. 9(a) and 9(b), only a part of the back 12a of the chip 12, that is, the back side of the transistor section 21 (the part of the back 12a opposite to the transistor section 21) is subjected to rough surface processing. Only this part is thinned down, with the others remaining the same.

Therefore, the chip 12 is thinned down in the transistor section 21 (for example, to 50 μm or less) and remains at the same thickness in the sensor section 22 and LSI circuit section 23 (for example, 200 μm or more).

Therefore, the chip 12 receives stress only in the transistor section 21 and deforms only in the transistor section 21 due to stress when detached from the board 3.

As described here, as to the chip 12, only a part of the back 12a (transistor section 21) is subjected to rough surface processing, resulting in non-uniform thickness. The chip 12 has such a structure that once it is detached from the board 3 and deforms due to stress, it returns to the level shape only with great difficulties.

The structure thereby never allows the chip 12 to completely return to the level shape even by, for example, vacuum adsorption on a level base. To put it differently, the chip 12, once deformed, by no means completely returns to the level shape. Nor can any analysis be conducted on the LSI 26 and other circuits, once the chip 12 is deformed, as described earlier.

Only a part of the back 12a of the chip 12 needs to be subjected to rough surface processing, to which part is applied stress. The processing may be carried out by means of, for example, scraping by dicing, or sand blast, sandpaper or treatment by laser beam projection.

The chip 12 only needs to, when detached from the board 3, at least partially deform due to stress or preferably is such that the transistor section 21 at least partially deforms convexly or concavely.

Further, there are no particular limitations on the materials of the package 8, board 3, anisotropic conducting glue 5, etc. of embodiments 1 and 2. The package 8 may be provided only when required. To put it differently, the semiconductor device 1, 11 may not be a packaged type. In addition, the semiconductor device 1, 11 may not be of a flipped-chip mounting type.

Only two factors need to be considered in determining to what extent the chip 2 is to be thinned down: the resultant chip 2 should receive a predetermined stress so that is deforms sufficiently when detached from the board 3; and the functions of the transistor, LSI circuit, and other components on the chip 2 should not be adversely affected when the chip 2 is level. Accordingly, there are no particular limitations on the thickness of the chip 2.

However, specifically, in view of the strength of silicon, the chip preferably has a thickness of 50 μm or less and more preferably in a range of 30 μm to 50 μm.

If being thinned down in this range, the chip 2 can avoid adversely affecting the functions of the transistor, LSI circuit, and other components when it is level, as well as can deform (e.g., warp) surely as desired when detached from the board 3.

As shown in FIG. 2, the sensor section 22 in the chip 2 is preferably interposed at least between the transistor section 21 and the LSI circuit section 23. This is because, as described earlier, the detector section is provided in the sensor section 22 so as to electrically connect the transistor to the LSI circuit.

However, the sensor section 22 is not necessarily positioned between the transistor section 21 and the LSI circuit section 23, and may be positioned anywhere as long as it can electrically connect the transistor section 21 to the LSI circuit section 23. Accordingly, there is no particular limitations on the relative positions of the transistor section 21, sensor section 22, and LSI circuit section 23.

The LSI circuit 26 shown in FIG. 3 includes an operation prohibition circuit 27 which allows the LSI circuit 26 to operate only when it receives low signal from the distortion sensor 25. Accordingly, the operation prohibition circuit 27 has a function of prohibiting the LSI circuit 26 from operating when the LSI circuit 26 alone is subjected to probing for circuit analysis.

Further, the operation prohibition circuit 27 only needs to be arranged to have the foregoing function and is not limited in any particular manner. The operation prohibition circuit 27 can be assembled from a resistor, for example. Alternatively, the operation prohibition circuit 27 may be arranged so that the power source and grounding of the distortion sensor 25 are provided at a common pad with the LSI circuit 26.

The distortion sensor 25 is not limited only to the arrangement shown in FIG. 3. The distortion sensor 25 only needs to be arranged to be capable of detecting changes in value of the characteristic current $I_d$ of the transistor 24 caused by the deformation of the level transistor section 21.

Specifically, for example, as the distortion sensor, an arrangement may be employed which, upon detection of a characteristic current of a predetermined value (or in a predetermined range), supplies such a signal (operation signal) to the LSI circuit that causes the LSI circuit to operate normally. Upon detection of a characteristic current of a value not equal to the predetermined value (or out of the predetermined range) or failure to detect the characteristic current, this distortion sensor preferably supplies such a signal (operation prohibit signal) to the LSI circuit that stops (prohibits) the operation of the LSI circuit. Another preferred arrangement is to stop the supply of the operation signal.

If the stress-induced deformation of the chip causes a change in an electrical property in any part of the chip other than the transistor section, a distortion sensor capable of detecting this change may be used as detector means. In this event, the distortion sensor is preferably arranged to detect a change in an electrical property occurring in that part and supplies a signal to the LSI circuit to prohibit the LSI circuit from operating.

In this manner, if such a part exists, the transistor section is not the only part which deforms due to stress (in which an electrical property changes) in the chip. In addition, the distortion sensor (detector section) may be positioned somewhere other than in the sensor section.

[Embodiment 3]

A third embodiment in accordance with the present invention will be now described. Here, for convenience, members of the present embodiment that have the same function as members of either of the first and second embodiments, and that are mentioned in that embodiment are indicated by the same reference numerals and description thereof is omitted.

FIG. 10(a) is an explanatory drawing showing an arrangement of a semiconductor device 30 of the present embodiment. As shown in this Figure, the semiconductor device 30 is of a packaged type including a silicon semiconductor element chip (semiconductor element; hereinafter, simply "chip") 31 sealed inside an epoxy resin package 37.

The chip 31 is secured onto a die pad (board) 32 interposed by a silver paste 33.

On the front of the chip 31 are there provided an electronic circuit section and a pad section 35 as will be described later in detail. The pad section 35 is electrically connected to a lead wire 36 via a gold wire 34. In this manner, the semiconductor device 30 has a structure of a wire bonding type.

The back 31a of the chip 31 is subjected to rough surface processing to provide stress to the chip 31. As a result of the rough surface processing, the chip 31 (especially, the processed part) warps convexly due to stress when removed from the package 37 (detached from the die pad 32) as shown in FIG. 10(b).

The chip 31 has thickness of 200 μm or more, whereas the part subjected to the rough surface processing is thinned down to 50 μm or less, and preferably in a range of 30 μm to 50 μm. Accordingly, the chip 31 (especially, the processing part) readily deforms due to stress when detached from the die pad 32.

The electronic circuit section provided on the front of the chip 31 includes a transistor section, a sensor section, and an LSI circuit section similarly to the electronic circuit section on the chip 2 shown in FIG. 2.

The transistor section is a part where transistors are provided at high density. The sensor section is a part where a detector section (detector means) is provided together with a comparator and other components so as to detect an electrical property of the transistors. The LSI circuit section is a part where circuitry including an IC (integrated circuit) or LSI (large-scale integration) circuit is provided.

Especially, the electronic circuit section (at least the transistor section) is provided where the chip 31 is thinned down.

Now, a method of manufacturing the semiconductor device 30 will be described as an example.

First, a lead frame 38 is fabricated including a die pad 32 and a lead wire 36 at positions that match the mounting position of the chip 31.

Figure 11:
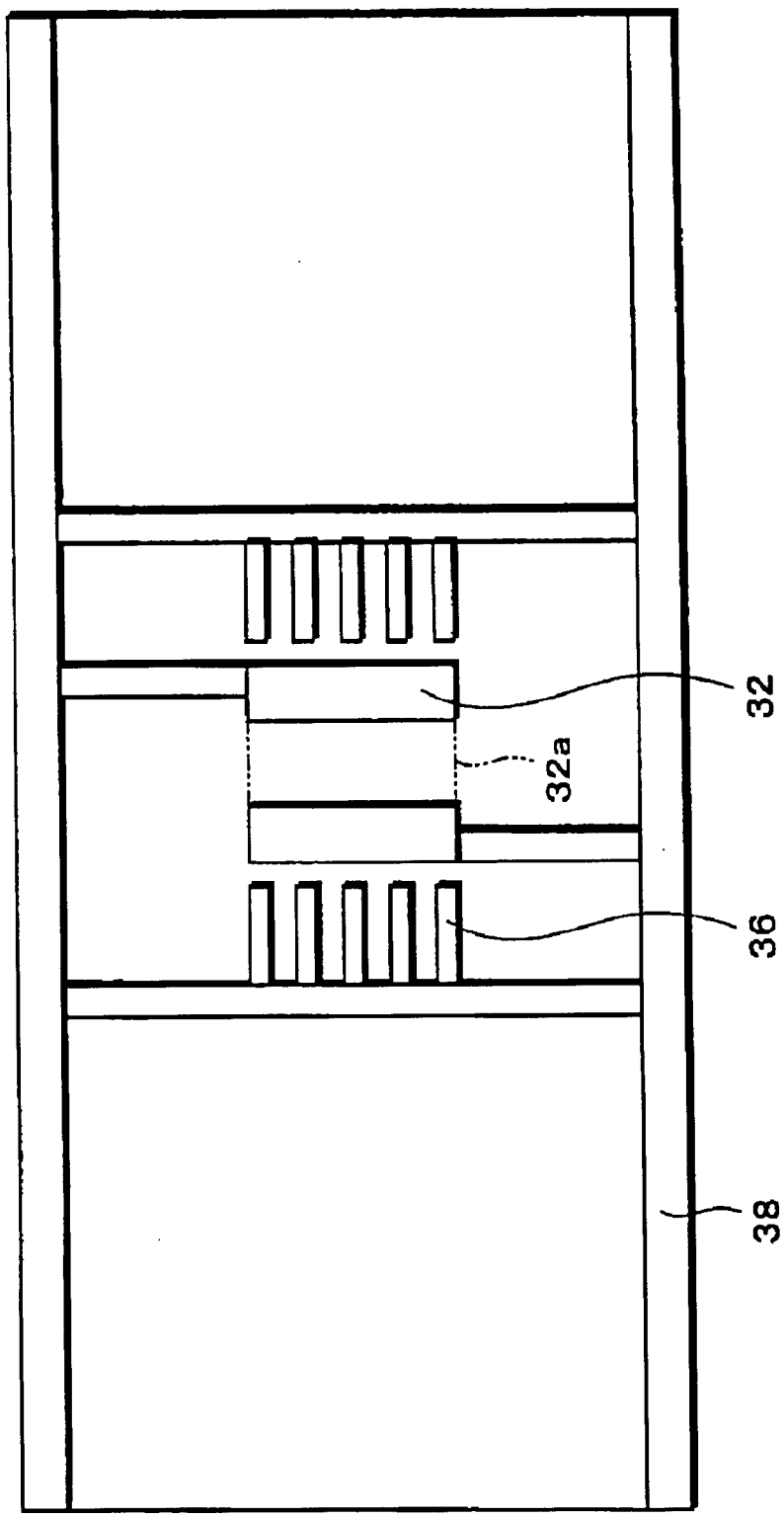
FIG. 11 is a plan view schematically showing an arrangement of a lead frame in the semiconductor device of FIG. 10(a).

A part of the die pad 32 is omitted to make a hollow space. Consequently, as shown in FIG. 11, the die pad 32 has a hollow section 32a to allow internal access during the processing carried out in a later step on at least a part of the back 31a of the chip 31.

Figure 12:
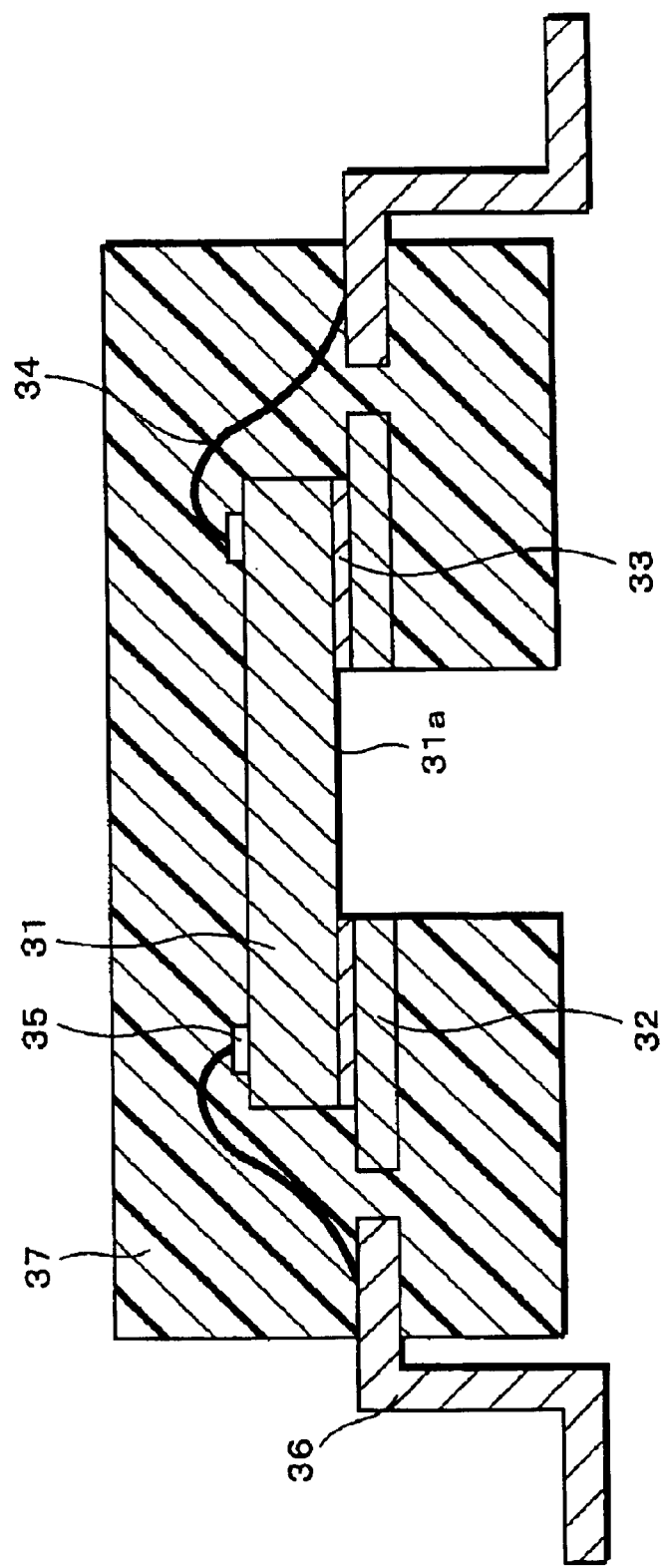
FIG. 12, in reference to an example of a manufacturing process of the semiconductor device of FIG. 10(a), is a cross-sectional view showing the semiconductor element chip having been secured to a die pad.

Next, as shown in FIG. 12, silver paste 33 is applied onto the die pad 32. The chip 31 is then placed on the die pad 32 while positioning correctly. The die pad 32 and chip 31 are compressed and secured to each other, while heating at about 160° C. to 170° C. The silver paste 33 solidifies due to the heating, securing the chip 31 onto the die pad 32.

The pad section 35 of the chip 31 is electrically connected (wire bonded) to the lead wire 36 by the gold wire 34. Thereafter, a part of the package 37 is formed using a predetermined mold, by sealing with epoxy resin the die pad 32 except the hollow section 32a, i.e., the chip 31 except a part of the back 31a to be processed.

Figure 13:
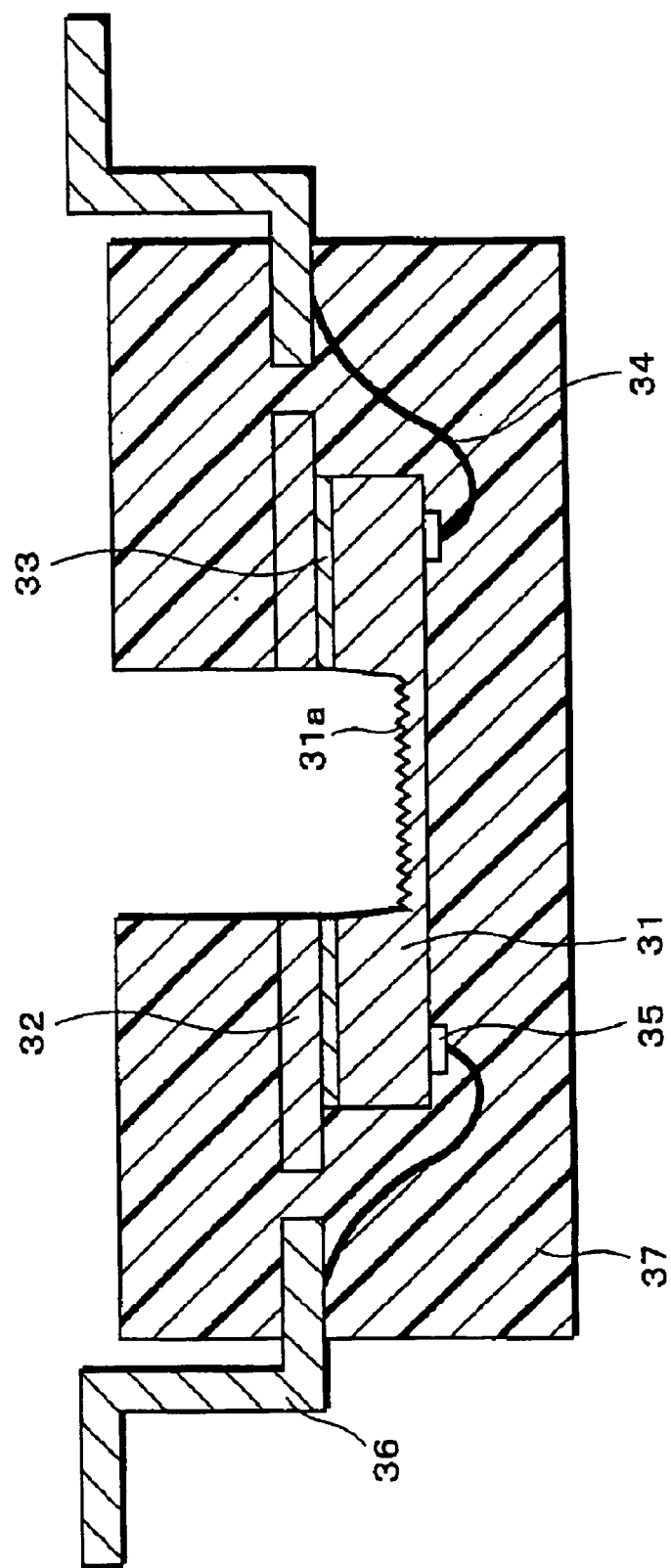
FIG. 13, in reference to an example of a manufacturing process of the semiconductor device of FIG. 10(a), is a cross-sectional view showing the semiconductor element chip having been processed on its back.

Then, the chip 31 thus secured and sealed is loaded in a predetermined place of a dicing machine. The back 31a of the chip 31 is scraped using a dicing blade provided in the dicing machine as shown in FIG. 13. The scraping is carried out to reduce the thickness of the chip 31 to 50 μm or less, preferably to a range of 30 μm to 50 μm. There are no particular requirements for the scraping.

Such scrape processing, that is, the provision of a rough surface and reduction in thickness of a part of the back 31a of the chip 31 enables a predetermined stress to be applied to the chip 31 (especially, the processed part).

Figure 14:
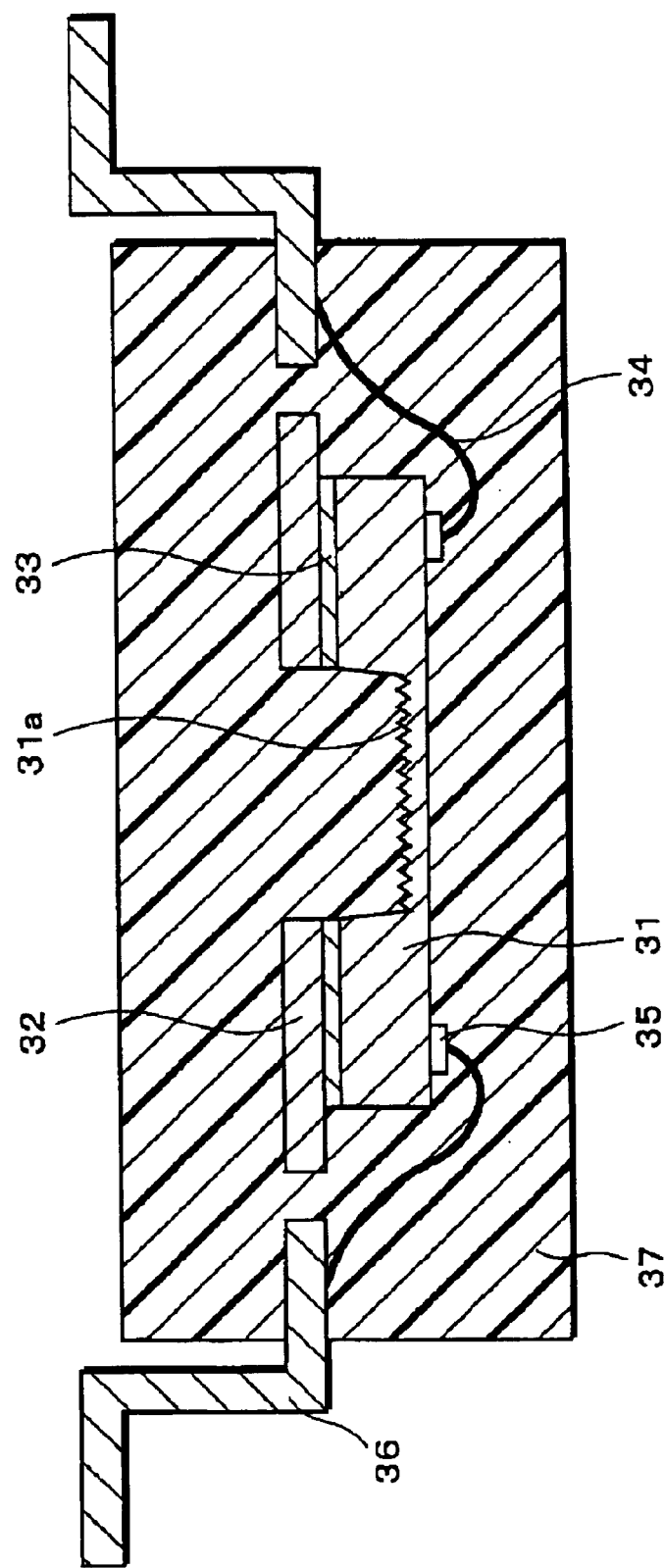
FIG. 14, in reference to an example of a manufacturing process of the semiconductor device of FIG. 10(a), is a cross-sectional view showing the semiconductor element chip having been packaged.

Then, as shown in FIG. 14, the back 31a of the processed chip 31 is sealed with epoxy resin using a predetermined mold to fabricate the package 37, which completes the manufacture of the semiconductor device 30.

In this manner, the chip 31 has its back 31a subjected to rough surface processing. Therefore, once detached from the die pad 32 and deformed by stress, the chip 31 never completely returns to the level shape even by, for example, vacuum adsorption on a level base. To put it differently, the chip 31, once deformed, by no means completely returns to the level shape. Nor can any analysis be conducted on the LSI and other circuits, once the chip 31 is deformed, as described in the first embodiment.

Specifically, if the package 37 is removed from the chip 31 followed by detachment of the chip 31 from the die pad 32, the chip 31 (especially, transistor section) warps convexly due to stress. The warp causes a property of the transistor section to change, increasing its characteristic current $I_d$ in value. Consequently, the characteristic voltage $V_1$ grows larger than the predetermined voltage $V_2$ ($V_1 > V_2$).

Therefore, the comparator Cp in the sensor section outputs high signal to the LSI circuit in the LSI circuit section, causing the operation prohibition circuit 27 to stop the operation of the LSI circuit. In these conditions, an attempt to conduct probing on the LSI circuit through application of drive voltage to the transistor 24 does not result in a successful circuit analysis.

Note that the chip 31 is scraped after sealed with epoxy resin. Therefore, the chip 31 can retain its level shape inside the semiconductor device 30 even when it is thinned down and receives stress.

Figure 15:
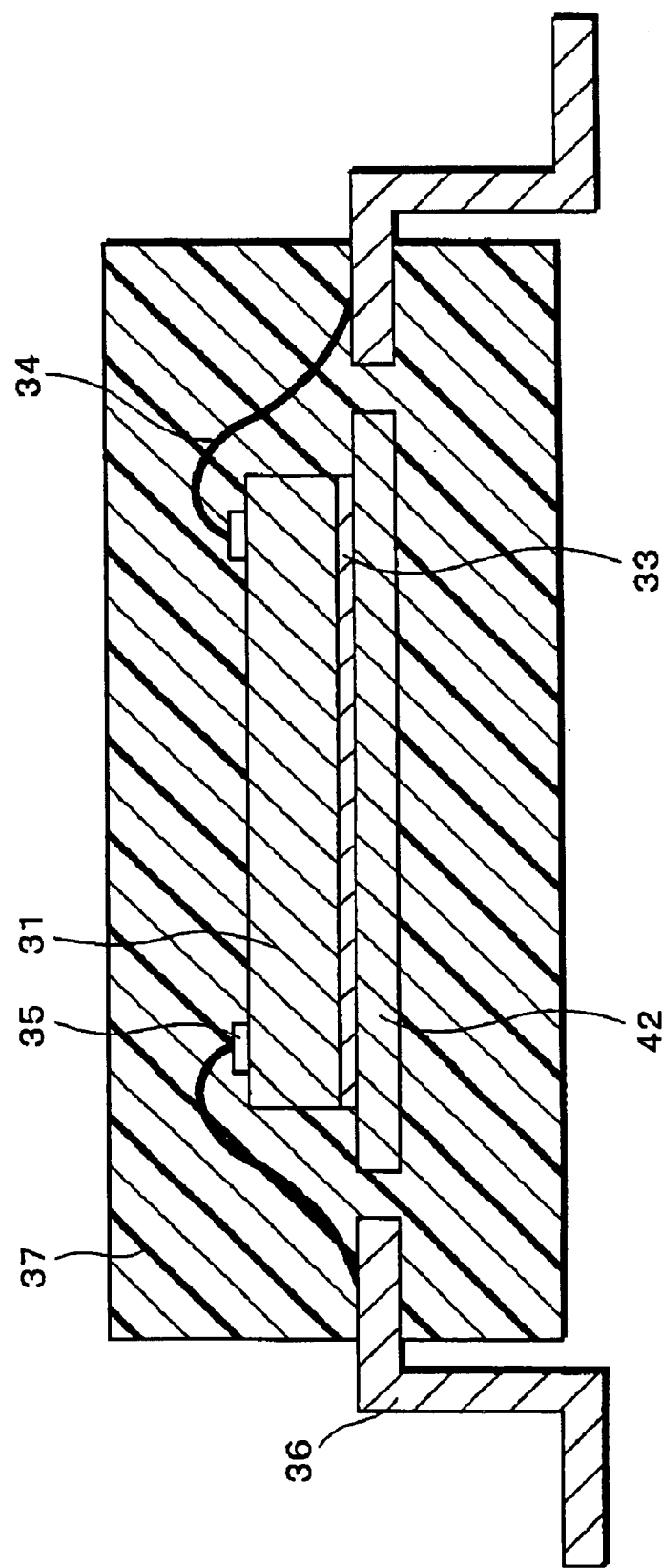
FIG. 15 is a cross-sectional view schematically showing an arrangement of a conventional semiconductor device of a wire bonding type.
Figure 16:
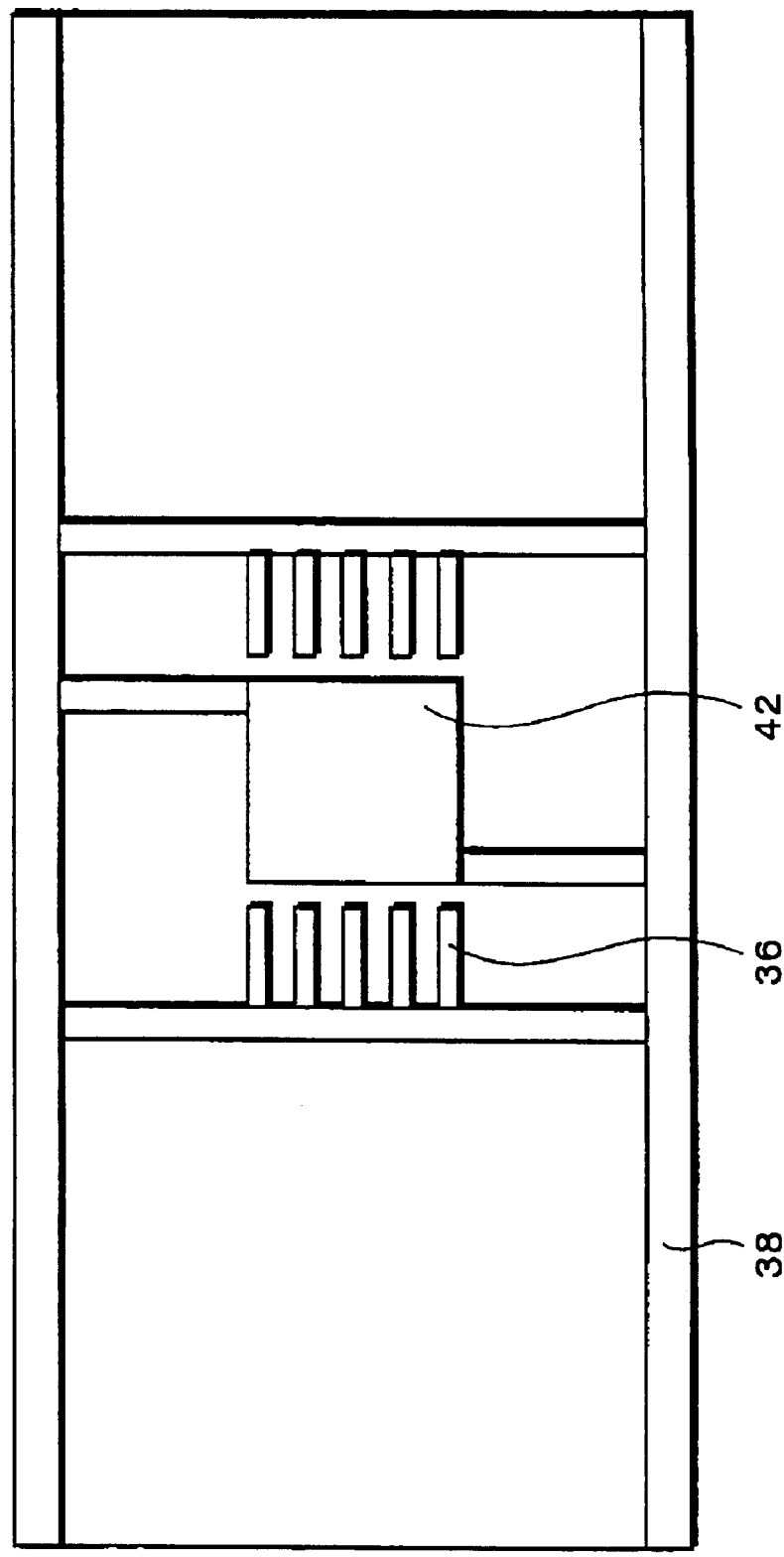
FIG. 16 is a plan view schematically showing an arrangement of a lead frame of the semiconductor device of FIG. 15.

As can be seen from FIG. 15 and FIG. 16, in a conventional semiconductor device in which a die pad 42 without a hollow section, the back of the chip 31 cannot be subjected to processing after the chip 31 is secure. By contrast, in the semiconductor device 30, the die pad 32 to which the chip 31 is secured has a hollow section 32a which offers access to the back 31a of the chip 31 for processing after the chip 31 is secured.

Throughout the first to third embodiments, the chip 2, 12, and 31 (transistor section 21) have been described to warp convexly. However, this is not the only possibility. Alternatively, after the chip may be subjected to such processing that the chip deforms and takes a different shape (for example, concavely) when detached from the board.

Further, throughout the first to third embodiments, the transistor in the transistor section 21 are of an NMOS type (N-type metal oxide semiconductor). However, the transistor in the transistor section 21 is not limited to an NMOS type, as long as its electrical property (e.g., characteristic current $I_d$) changes when the transistor section 21 deforms. Similarly, there are no particular limitations on the specific arrangement of the circuit provided in the LSI circuit section 23.

For example, the transistor section 21 may include a transistor of a PMOS type (P-type metal oxide semiconductor).

With a PMOS transistor, the value of the characteristic current $I_d$ changes oppositely; therefore, for example, by setting the reference oppositely for the comparator Cp, an identical effect is produced with an NMOS transistor.

Specifically, when the PMOS transistor is used, a stress (external force) is applied to the transistor section 21 so that it warps convexly in a direction perpendicular to current flow through the transistor and normal to the front of the chip 2, and as a result, the transistor section 21 actually warps due to the stress, forming a warped surface having a radius (r) of 10 mm. In these circumstances, the transistor, when activated, shows a 10% decrease in its channel current.

If the semiconductor device is not of a flipped-chip mounting type, for example, the semiconductor element chip (semiconductor element) only needs to be covered all over (including the board) with a single material. Alternatively, the back of the semiconductor element chip is covered with a material having a higher rate for etchant than that of the material covering the front of the semiconductor element chip.

In this alternative, if the front of the semiconductor element chip is to be exposed by etching, the etchant reaches and etches the back of the semiconductor element chip too, thereby forcing the semiconductor element chip to deform when detached.

There are no particular limitations on the material of the package 37, die pad 32, and other members of the third embodiment.

The third embodiment only refers to a case where the back 31a of the chip 31 is partially scraped by dicing; however, the back 31a of the chip 31 may be scraped by a method other than dicing.

Further, there are no particular limitations on which parts of the chip 31 is (are) to be thinned down. However, the chip 31 is preferably thinned down so that at least the transistor section deforms due to stress to enable the distortion sensor (detector section) to detect an electrical property of the transistor.

Now, a brief description will be given below why a back-scraped (treated) chip warps by taking a wafer fabricated into chips as an example.

In manufacture of a semiconductor device, typically, a wafer made of chip base material (e.g., silicon) is polished and divided into a number of chips which are then packaged.

In the polishing, normally, a wafer is thinned down from its original thickness of 725 µm to about 200 µm to 300 µm, using grinding stone (#2000 to finish off the process).

Figure 17:
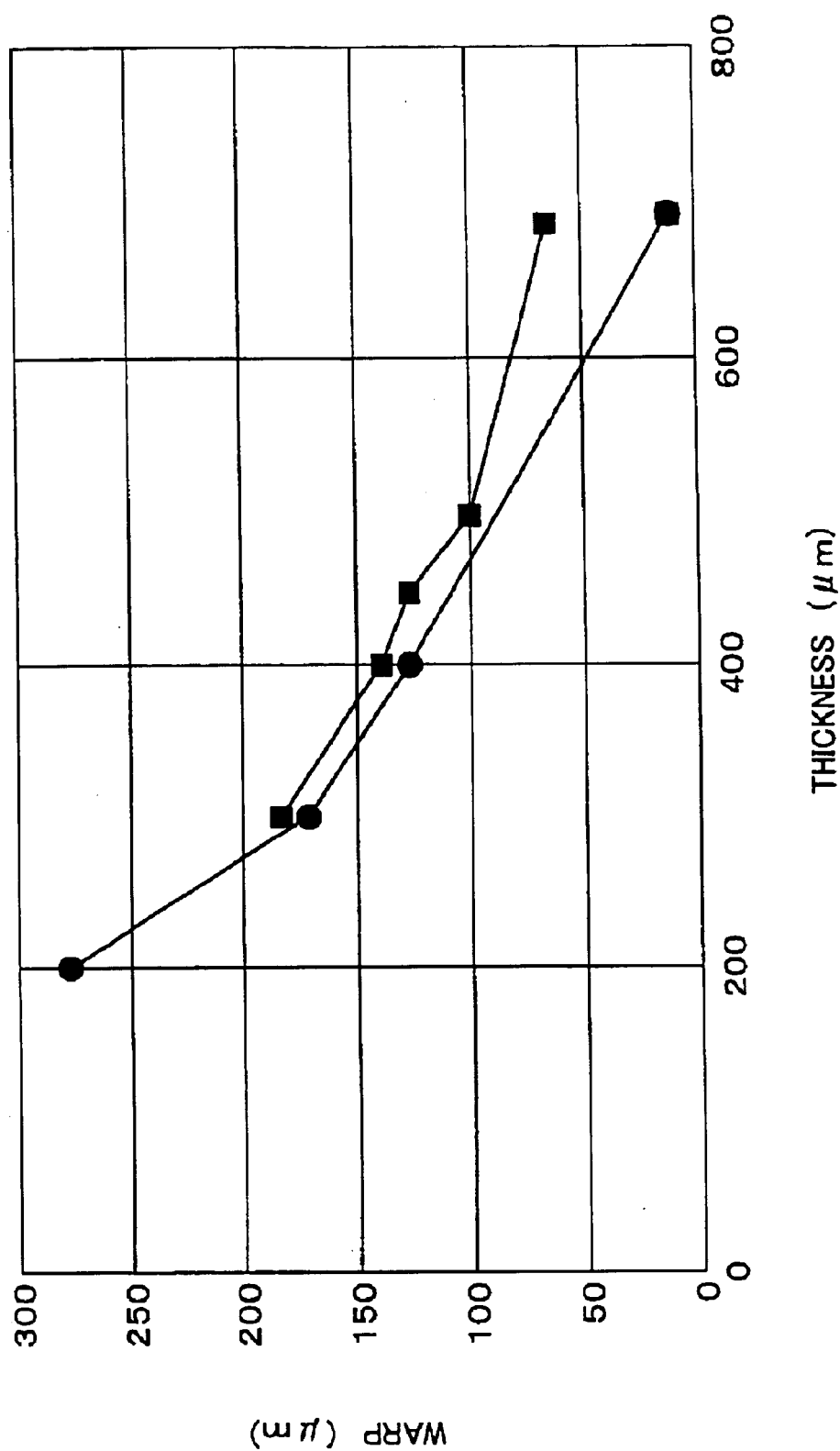
FIG. 17 is a graph showing measurements of relationships between the thickness and warp (degrees of warp) of wafers (made of chip base material) which have been thinned down from their original thickness of 725 $\mu$m by polishing.

FIG. 17 is a graph showing measurements of relationships between the thickness and warp (degree of warp) of wafers which have been thinned down from their original thickness of 725 µm by polishing. Measurements were made on two round wafers (distinguished by ■ and ●) of 8 inches in diameter which had the same specifications.

A warp of the wafer is defined as the difference (distance) between the highest and lowest points on the wafer mounted on a flat plane. The round wafer warps like a dome, so the warp is defined as the difference between the center and edge.

As shown in the graph of FIG. 17, as the polishing progresses and the wafer is thinned down, the wafer warps increasingly.

Figure 18:
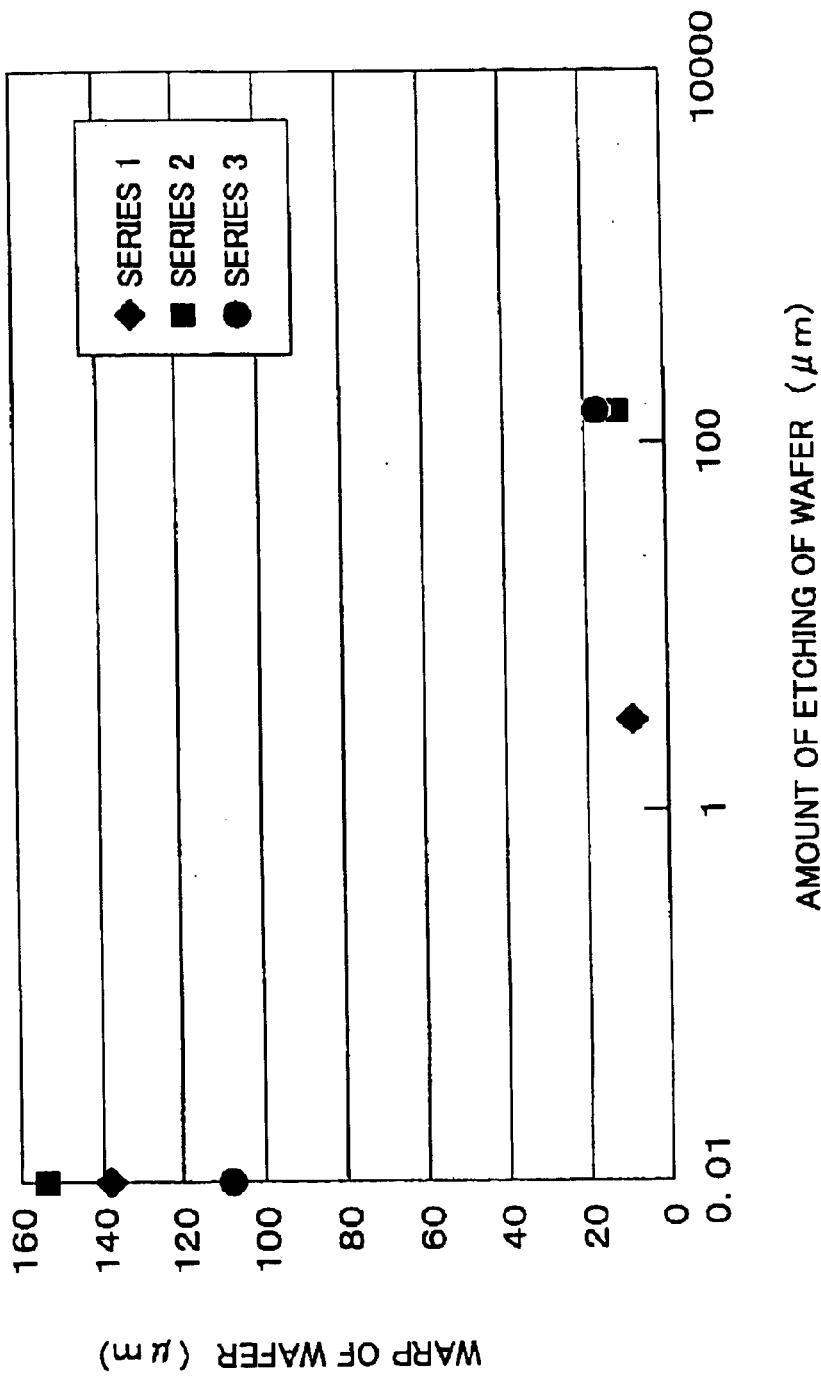
FIG. 18 is a graph showing measurements of relationships between amounts of etching and warp of wafers whose polished surfaces have been wet etched.
Figure 19:
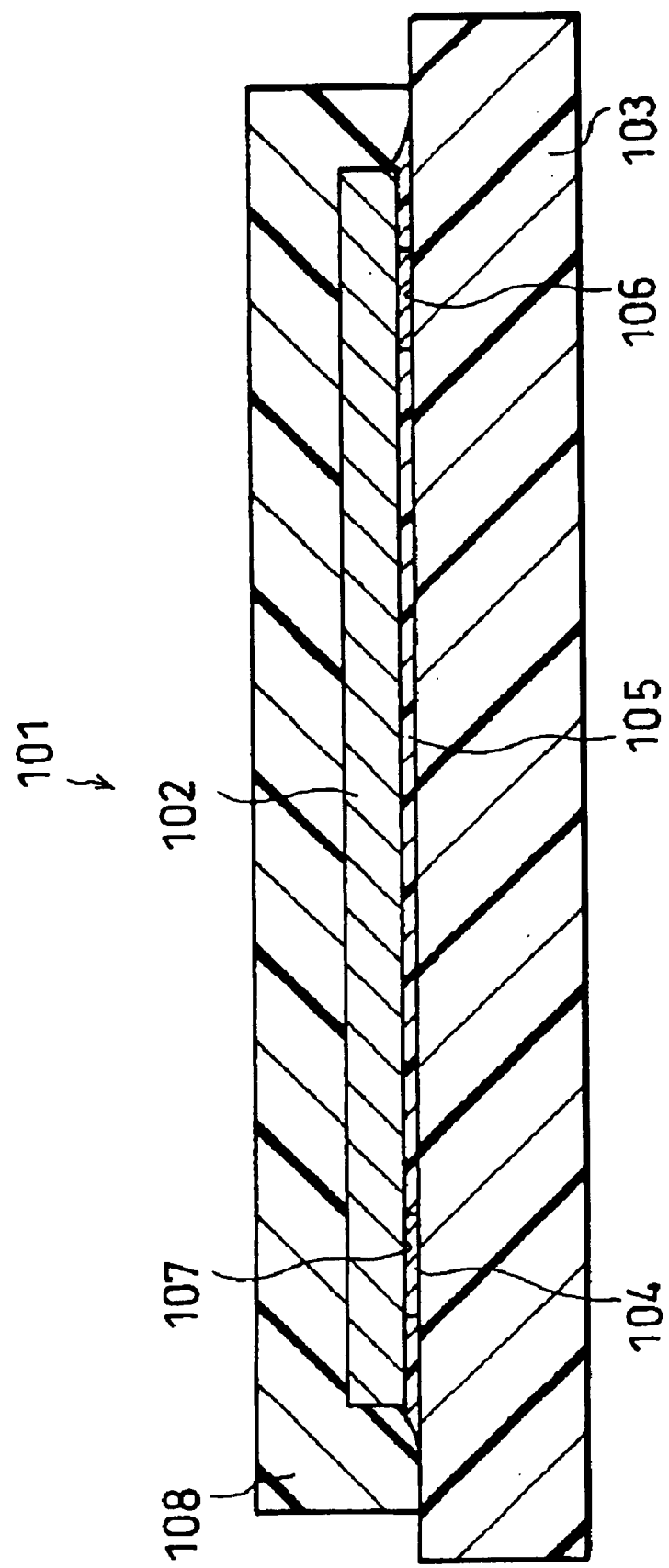
FIG. 19 is a cross-sectional view schematically showing an arrangement of a conventional semiconductor device of a flipped-chip mounting type.

FIG. 18 is a graph showing measurements of relationships between amounts of etching and warp of wafers whose polished surfaces have been wet etched. Measurements were made on three wafers (distinguished by ♦, ■ and ●) which had the same specifications.

As shown in the graph of FIG. 18, etching about 1 µm of the polished surface to form a mirror surface enables the warped wafer to revert to the original shape.

Considering the two graphs (data) in combination, it is understood that a stressed layer so thin (about 1 µm) as to be removable by etching is formed on the wafer by the polishing (scraping) and warps the wafer.

We assume that polishing (scraping) of the wafer results in formation of a stress layer for the following reasons.

A wafer made of semiconductor base material (chip base material, typically silicon) retains its normal state (non-stressed state) as long as the surface crystals are interconnected orderly. Polishing damages the wafer surface and breaks the connections linking crystals, disrupting the orderly crystalline structure. The part of the surface subjected to polishing and thereby undergoing disruption in the crystalline structure in this manner becomes a stressed (disrupted) layer.

Theoretically, the relationship between warp and stress are given by $$\sigma = (E \cdot h^2)/(1-\upsilon) \cdot 6 \cdot Rt)$$

where $E/(1-\upsilon)$ is the elastic coefficient of the wafer in Pa, h is the thickness of the wafer, t is the thickness of the stressed layer, R is the radius of curvature matched to the warp of the wafer, and $\sigma$ is the mean value of stress.

The radius of curvature matched to the warp decreases with an increase in the warp. Therefore, the above formula shows that the wafer warps in inverse proportion to the square of its thickness. This well coincides with the measurements shown in FIG. 17 (there is only one variable parameter involved: the thickness of the wafer).

The present invention exploits this warping caused by the stressed layer, where the polishing (scraping) is carried out by scraping (processing) by means of dicing, sand blast, or sandpaper.

Scraping by means of dicing, sand blast, or sandpaper results in formation of a stressed layer similarly to the foregoing polishing and thereby causes the wafer to warp. If the chip is thinned down (less than or equal to 50 µm), the chip warps more readily. Laser treatment also produces a similar stressed layer.

As described so far, a semiconductor device in accordance with the present invention (the present semiconductor device) includes a semiconductor element secured to a board, including:

a detector section for detecting detachment of the semiconductor element from the board; and an operation prohibition section for prohibiting operation of the semiconductor element when the detector section has detected the detachment of the semiconductor element from the board.

The present semiconductor device is arranged so that when the semiconductor element has been detached (or is to detached) from the board, the operation prohibition section causes the semiconductor element to be incapable of operating. Hence, with the present semiconductor device, the semiconductor element is specified to failed to operate normally once detached from the board.

This prevents anyone unrelated to the manufacture of the present semiconductor device from conducting detailed analysis on the semiconductor element and thereby ensures safe concealment of secrets about the semiconductor element (e.g., operational properties of the integrated circuit).

It is preferred in the present semiconductor device if the semiconductor element is specified to deform when detached from the board and the detector section is specified to detect the detachment of the semiconductor element from the board through detection of the deformation of the semiconductor element. This allows the use of the distortion sensor as the detector section and facilitates the realization of the semiconductor device.

It is further preferred in this case if the semiconductor element includes a transistor having an electrical property changing according to the deformation of the semiconductor element and the detector section is specified to detect the deformation of the semiconductor element through detection of the change in the electrical property of the transistor.

The NMOS and PMOS transistors change electrical properties according to their deformation. Therefore, the deformation and detachment of the semiconductor element are detectable through detection of the change. This facilitates the provision of the present semiconductor device.

It is further preferred in this case if the detector section is specified to output an operation signal to the operation prohibition section when the electrical property of the transistor does not change and to stop the output of the operation signal when the electrical property of the transistor changes, and the operation prohibition section is specified not to prohibit the operation of the semiconductor element only while receiving the operation signal. This enables the operation of the operation prohibition section to be readily controllable.

It is also preferred in the present semiconductor device either if both the detector section and the operation prohibition section are formed on the semiconductor element or if the operation prohibition section is formed on the semiconductor element. This enables the operation prohibition section to continue to be in control even after the semiconductor element is completely detached from the board and separated from the present semiconductor device.

To specify the semiconductor element to deform if it is detached from the board, such stress should be applied to the semiconductor element when it is secured to the board that could otherwise deform the semiconductor element. The stress is provided by subjecting the semiconductor element either partially or entirely to rough surface processing when it is secured to the board. To facilitate the deformation, it is preferred if the semiconductor element has a reduced thickness of 50 μm or less (preferably, 30 μm to 50 μm) where the semiconductor element is subjected to the rough surface processing.

To describe the present invention differently, the present invention, for example, relates to a semiconductor device which can prevent analysis of the properties of the semiconductor element and circuit by making use of a change or the like that occurs to an electrical property of the transistor, integrated circuit, etc. as a result of the semiconductor element warping or otherwise deforming when the semiconductor element is detached from the board, as well as a method of manufacturing such a semiconductor device.

The semiconductor device in accordance with the present invention may be such that the semiconductor element including an integrated circuit is secured level onto the board in, for example, a package and operates normally only when the semiconductor element is level. The semiconductor element is specified to be receiving a stress (static stress) as a result of processing carried out on at least a part of its back and, when detached from the board, at least partially deform due to the stress. Therefore, when the semiconductor element is detached from all the other members and is no longer capable of retain its level shape, it changes in electrical and other properties and fail to operate normally. The semiconductor device in accordance with the present invention is specified to prevent analysis of the properties of the semiconductor element and circuit by making use of a change or the like that occurs to an electrical property of the transistor, integrated circuit, etc. as a result of the semiconductor element warping or otherwise deforming when the semiconductor element is detached from the board.

The chip 2 of FIGS. 1(a) and 1(b) may be secured via glue (anisotropic conducting glue) 5 onto a glass epoxy board (board) 3 formed by immersing, for example, epoxy resin in glass fiber. Since the bump 4 of the pad section 7 provided on the front of the chip 2 is connected to the wire section 6 made of copper film on the board 3, the semiconductor device 1 is of a flipped-chip mounting type.

The back 2a of the chip 2 may be subjected to predetermined processing and thereby entirely receives stress so that the chip 2 deforms when the chip 2 is removed from the package 8, that is, when the chip 2 is detached from the board 3.

The detector section in the sensor section 22 of FIG. 2 may have a function of detecting a property of the transistor shown only when the transistor section 21 is level or an electrical property unique to a level part to control the operation of the LSI circuit in the LSI circuit section 23 and also a function of detecting a change in electrical properties of the transistor section 21 when the transistor section 21 deforms (becomes no longer level) to stop controlling the operation of the LSI circuit in the LSI circuit section 23.

The distortion sensor 25 of FIG. 3 is an example of an OP-amplifier as the detector means provided in the chip 2. The LSI circuit 26 of FIG. 3 may include the operation prohibition circuit 27 for prohibiting the LSI circuit 26 from operating, so as not to operate unless it receives a signal from the comparator Cp. The provision of the operation prohibition circuit 27 prevents the LSI circuit 26 from operating unless the LSI circuit 26 receives a signal from the comparator Cp.

In the arrangement of FIG. 3, when the transistor 24 receives a drive voltage, the characteristic voltage $V_1$ develops depending on the resistor R connected to the transistor 24 and the characteristic current $I_d$ flowing through the transistor 24. The characteristic voltage $V_1$ is applied to one of the two input terminals of the comparator Cp. The comparator Cp compares the characteristic voltage $V_1$ with the predetermined voltage $V_2$ applied in advance to the other input terminal to determine which voltage is higher and outputs low signal from the output terminal to the LSI circuit 26 if the characteristic voltage $V_1$ is either lower than or equal to the predetermined voltage $V_2$, and conversely, outputs high signal from the output terminal to the LSI circuit 26 if the characteristic voltage $V_1$ is higher than the predetermined voltage $V_2$. The operation of the LSI circuit 26 is controlled by the low and high signal from the distortion sensor 25. The LSI circuit 26 is thus specified to operate only when it receives low signal.

The step of mounting the chip 2 on the board 3 in the manufacture of the semiconductor device 1 of FIG. 1(a) may be alternatively described as following.

First, the board 3 is fabricated including external output wiring for the wire section G so that the wiring matches in position the pad section 7 provided on the front of the chip 2 having a thickness of 200 μm or more. Meanwhile, a bump 4 is formed of gold on the pad section 7 on the front of the chip 2.

Then, as shown in FIG. 4, after coating the board 3 with anisotropic conducting glue 5, the chip 2 is stacked on the board 3 so that the wire section 6 of the board 3 matches the bump 4 on the chip 2 in position. The chip 2 and the board 3 are compressed and secured to each other, while heating at about 200° C. The glue 5 solidifies due to the heating, securing the chip 2 onto the board 3. In other words, the chip 2 is mounted in a flipped posture so as to be level on the board 3.

In addition, the scraping of the back 2a by means of the dicing blade 9 shown in FIG. 4 to FIG. 6 is preferably carried out in a specified direction (for example, in a direction normal to the paper showing FIG. 5), that is, in a one direction so that the chip 2 readily deforms due to stress.

The chip 2 can entirely receive a predetermined stress as a result of the scrape processing by means of the dicing blade 9 as shown in FIG. 4 to FIG. 6, that is, as a result of the rough surface processing carried out on the back 2a entirely.

The semiconductor device 11 includes identical components as the semiconductor device 1 of the first embodiment, except the chip.

The chip 12 described in the second embodiment only needs to receive stress by processing at least a part of its back 12a. Therefore, if the processing is to be carried out by at least one method selected from the group consisting of scraping by means of dicing, sand blast, and sandpaper and treatment by means of laser beam projection, at least a part of the back 12a of the chip 12 needs to be processed. The chip 12 only needs to be specified so that at least a part of the chip 12 deforms, and more preferably at least a part of the transistor section 21 deforms convexly or concavely, due to stress when detached from the board 3.

The semiconductor device 1 (11) of the first (second) embodiment is arranged so that the chip 2 (12) is secured level onto the board 3 (for example, with the chip being flipped) and operates normally only when it is level. Consequently, the chip 2 (12), when detached from the board 3 and is deformed, causes a change in an electrical or other property of, for example, the transistor section 21 and fails to operate normally. Thus, the chip 2 (12) is protected from analysis of the integrated circuit, and the secret information on the chip 2 (12) is safely concealed.

The chip 31 is secured onto the die pad (board) 32 interposed by the silver paste 33. The pad section 35 formed on the front of the chip 31 is electrically connected to the lead wire 36 via the gold wire 34. Therefore, the semiconductor device 30 has a structure of a wire bonding type. The back 31a of the chip 31 partially receives stress as a result of predetermined processing in such a fashion that the chip 31 deforms when the chip 31 is removed from the package 37, that is, when the chip 31 is detached from the die pad 32.

Similarly to the chip 2 of the first embodiment, the chip 31 includes a transistor section where transistors are provided at high density, a sensor section where detector means is provided together with a comparator and other components to detect an electrical property of the transistors, and an LSI circuit section where circuitry including an IC or LSI circuit is provided. In the present embodiment, the chip 31 has thickness of 200 μm or more and partially thinned down to 50 μm or less and more preferably to a range of 30 μm to 50 μm. Therefore, the chip 31 readily deforms when detached from the die pad 32 due to stress applied to a part of the back 31a which is the processed part.

A part of the die pad 32 is omitted to make a hollow space. Consequently, the die pad 32 has a hollow section 32a to allow internal access during the processing carried out in a later step on at least a part of the back 31a of the chip 31.

Further, it is a fact confirmed by the data shown in FIGS. 17 and 18 that polishing (scraping) results in the formation of a stressed layer on the wafer (chip) and causes the wafer to warp.

The back of the polished wafer bears scratches from the polishing. Damaged semiconductor base material (typically, silicon) has its crystalline structure disrupted. Silicon can retain its normal state as long as crystals are interconnected orderly. But in damaged silicon, the orderly crystalline structure is disrupted and broken with the crystal connections cut off. This disrupted part presumably becomes a stressed layer.

The present invention may be described as follows, by way of the first to sixth semiconductor devices and the first to third methods of manufacturing a semiconductor device.

The first semiconductor device is a semiconductor device, in which a semiconductor element with an integrated circuit is secured to a board, and is arranged so that the semiconductor element is secured level and specified to operate normally only when the semiconductor element is level.

According to the arrangement, the semiconductor element is specified to operate normally only when it is level. Therefore, if the semiconductor element is no longer capable of sustaining its level shape as a result of, for example, detachment of the semiconductor element from the board, the semiconductor element does not operate normally due to a resultant change and the like in its electrical properties. This ensures that any analysis is prohibited from being conducted on the integrated circuit on the semiconductor element. Thus, secrets can be concealed safely about the semiconductor element.

The second semiconductor device is arranged so that, in the first semiconductor device, the semiconductor element is of a flipped-chip mounting type.

According to the arrangement, to conduct analysis on the integrated circuit on the semiconductor element, the semiconductor element must be detached from the board. However, the semiconductor element, once detached from the board, is no longer capable of sustaining its level shape and fails to operate normally due to a resultant change in its electrical properties. Thus, secrets can be concealed safely about the semiconductor element.

The third semiconductor device is arranged so that in either one of the first and second semiconductor devices, the semiconductor element receives such stress as a result of processing at least a part of a back thereof that when the semiconductor element is detached from the board, the semiconductor element at least partially deforms due to the stress.

According to the arrangement, the semiconductor element is specified to at least partially deforms due to stress when detached from the board. Thus, a change occurs to an electrical property, and secrets can be concealed more safely.

The fourth semiconductor device is arranged so that in any one of the first to third semiconductor devices, the semiconductor element has a thickness of 50 μm or less where the semiconductor element is processed.

According to the arrangement, the semiconductor element, having a typical thickness of 200 μm or more, is fabricated so that when the semiconductor element is detached from the board, the processed, and thereby thinned down part more readily deforms due to stress. Thus, secrets can be concealed more safely.

The fifth semiconductor device is arranged so that in the first to fourth semiconductor devices, the semiconductor element is specified to include a transistor section where transistors are provided at high density, the transistor section at least partially deforming convexly or concavely due to the stress.

According to the arrangement, the semiconductor element is specified so that when the semiconductor element is detached from the board, the transistor section at least partially deforms convexly or concavely due to stress. Thus, a change occurs to an electrical property, and secrets can be concealed more safely.

The sixth semiconductor device is arranged so that in any one of the first to fifth semiconductor devices, the semiconductor element includes detector means for detecting an electrical property developing in a level part only when the level part is level, so as to control operation of the integrated circuit.

According to the arrangement, the semiconductor element, if the semiconductor element is no longer capable of sustaining its level shape as a result of detachment from the board, a change occurs to its electrical properties. With the detector means detecting the change occurring to the electrical properties and thereby stopping the control of the operation of the integrated circuit, the semiconductor element fails to operate normally. This further ensures that any analysis is prohibited from being conducted on the integrated circuit on the semiconductor element. Thus, secrets can be concealed more safely.

The first method of manufacturing a semiconductor device includes, after securing a semiconductor element with an integrated circuit to a board so as to be level, the step of processing at least a part of a back of the semiconductor element to develop such stress that when the semiconductor element is detached from the board, at least a part thereof deforms.

According to the arrangement, the semiconductor element is given such stress that when the semiconductor element is detached from the board, at least a part thereof deforms. Therefore, if the semiconductor element is detached from the board and can no longer sustain its level shape, the semiconductor element does not operate normally due to a resultant change and the like in its electrical properties. This ensures that any analysis is prohibited from being conducted on the integrated circuit on the semiconductor element. Thus, a semiconductor device can be manufactured in which secrets can be concealed safely about the semiconductor element.

The second method of manufacturing a semiconductor device is arranged so that in the first method of manufacturing a semiconductor device, the processing step is specified to be carried out by at least one technique selected from the group consisting of scraping by means of dicing, sand blast, and sandpaper and treatment by means of laser beam projection.

According to the method, the semiconductor element is given stress using an easy, convenient technique. Thus, a semiconductor device can be readily manufactured in which secrets can be concealed safely.

The third method of manufacturing a semiconductor device is arranged so that in either one of the first and second methods of manufacturing a semiconductor device, the semiconductor element is fabricated to have a thickness of 50 $\mu$m or less where the semiconductor element is processed.

According to the method, the semiconductor element, having a typical thickness of 200 $\mu$m or more, is fabricated so that the processed, and thereby thinned down part more readily deforms due to stress. Thus, a semiconductor device can be readily manufactured in which secrets can be concealed more safely.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, including a semiconductor element with an integrated circuit secured to a board,
    wherein the semiconductor element is secured in a level position and specified to operate normally only when the semiconductor element is maintained in this level position,
    wherein at least part of a back of the semiconductor element is subjected to surface processing and a stress is applied to the semiconductor element because of the surface processing, wherein the stress causes at least part of the semiconductor element to deform when being detached from the board, whereby said stress prohibits any reliable analysis of the semiconductor element once the semiconductor element is detached from the board.

2. The semiconductor device as defined in claim 1, wherein the semiconductor element is of a flipped-chip mounting type.

3. The semiconductor device as defined in claim 1,
    wherein the semiconductor element has a thickness of 50 $\mu$m or less in the area where the semiconductor element is surface processed.

4. The semiconductor device as defined in claim 1,
    wherein the semiconductor element is specified to include a transistor section wherein transistors are provided at high density, the transistor section at least partially deforming convexly or concavely due to the stress when detached from the board.

5. The semiconductor device as defined in claim 1,
    wherein the semiconductor element includes detector means for detecting an electrical property developing only when the semiconductor element is level, so as to control operation of the integrated circuit.

6. A method of manufacturing a semiconductor device, comprising the steps of:
    (i) securing a semiconductor element having an integrated circuit to a board so that the semiconductor element is maintained in a level position;
    (ii) subjecting at least a part of a back of the semiconductor element to surface processing, wherein the surface processing applies a stress to the semiconductor element, the stress causing at least a part of the semiconductor element to deform when being removed from the board, whereby said stress prohibits any reliable analysis of the semiconductor element once the semiconductor element is detached from the board,
    wherein the semiconductor element only operates normally when the semiconductor device is maintained in the board in the level non-deforming position.

7. The method of manufacturing a semiconductor device as defined in claim 6,
    wherein the step (ii) is specified to be carried out by at least one technique selected from a group consisting of scraping by means of dicing, sand blast, and sandpaper and treatment by means of laser beam projection.

8. The method of manufacturing a semiconductor device as defined in claim 6, wherein the step (ii) results in the semiconductor element having a thickness of 50 $\mu$m or less where the semiconductor element is surface processed.

9. A semiconductor device including a semiconductor element secured to a board, comprising:
    a detector circuit section for detecting detachment of the semiconductor element from the board as a result of deformation of the semiconductor element from a applied stress; and
    an operation prohibition circuit section for prohibiting operation of the semiconductor element when the detector circuit section has detected the detachment of the semiconductor element from the board, and thereby preventing any reliable analysis of the semiconductor element when detached.

10. The semiconductor device as defined in claim 9, wherein:
    the semiconductor element is specified to deform when being detached from the board; and the detector circuit section is specified to detect the detachment of the semiconductor element from the board through detection of the deformation of the semiconductor element.

11. The semiconductor device as defined in claim 10, wherein:
the semiconductor element includes a transistor having an electrical property that changes according to the deformation of the semiconductor element; and
the detector circuit section is specified to detect the deformation of the semiconductor element through detection of the change in the electrical property of the transistor.

12. The semiconductor device as defined in claim 11, wherein:
the detector circuit section is specified to output an operation signal to the operation prohibition circuit section when the electrical property of the transistor is unchanged from its normal operating status and ceases the output of the operation signal when the electrical property of the transistor changes; and
the operation prohibition circuit section does not prohibit the operation of the semiconductor element while receiving the operation signal.

13. The semiconductor device as defined in claim 11, wherein the transistor is of either an NMOS or PMOS type.

14. The semiconductor device as defined in claim 9, wherein the operation prohibition circuit section is specified to prohibit operation of an integrated circuit provided in the semiconductor element.

15. The semiconductor device as defined in claim 9, wherein the detector circuit section and the operation prohibition circuit section are formed on the semiconductor element.

16. The semiconductor device as defined in claim 10, wherein the semiconductor element, when secured to the board, receives a stress that could deform the semiconductor element when it is being detached from the board.

17. The semiconductor device as defined in claim 16, wherein the semiconductor element is at least partially subjected to rough surface processing when the semiconductor element is secured to the board.

18. The semiconductor device as defined in claim 17, wherein the semiconductor element has a thickness of 50 $\mu$m or less where the semiconductor element is subjected to the rough surface processing.

19. The semiconductor device as defined in claim 17, wherein the semiconductor element has a thickness of 30 $\mu$m to 50 $\mu$m where the semiconductor element is subjected to the rough surface processing.

20. A semiconductor device, in which a semiconductor element with an integrated circuit is secured to a board,
wherein the semiconductor element is secured in a level non-deforming position and specified to operate normally only when the semiconductor element is maintained in this level position,
wherein the semiconductor element includes detector means for detecting an electrical property within the semiconductor element only when the semiconductor element is maintained in the level non-deforming position, so as to control operation of the integrated circuit, wherein the detector means stops functioning when the semiconductor element is in a non-level deforming position.

21. A method of manufacturing a semiconductor device, comprising the steps of:
(a) securing a semiconductor element having an integrated circuit to a board so that the semiconductor element is maintained in a level non-deforming position;
(b) subjecting at least a part of a back of the semiconductor element to surface processing, wherein the surface processing applies a stress to the semiconductor element, the stress causing at least a part of the semiconductor element to deform when being removed from the board and thereby preventing any reliable analysis of the semiconductor element when detached,
wherein the step (b) is specified to be carried out by at least one technique selected from a group consisting of scraping by means of dicing, sand blast, and sandpaper and treatment by means of laser beam projection.

* * * * *